(12) United States Patent
Ashizawa et al.

(10) Patent No.: US 12,399,437 B2
(45) Date of Patent: Aug. 26, 2025

(54) DEBRIS MITIGATION DEVICE AND LIGHT SOURCE APPARATUS INCLUDING THE SAME

(71) Applicant: Ushio Denki Kabushiki Kaisha, Tokyo (JP)

(72) Inventors: Noritaka Ashizawa, Tokyo (JP); Hironobu Yabuta, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 375 days.

(21) Appl. No.: 18/141,327

(22) Filed: Apr. 28, 2023

(65) Prior Publication Data
US 2023/0418170 A1    Dec. 28, 2023

(30) Foreign Application Priority Data

Jun. 27, 2022   (JP) ................................ 2022-102501

(51) Int. Cl.
*G03F 7/00*     (2006.01)
(52) U.S. Cl.
CPC ...... *G03F 7/70916* (2013.01); *G03F 7/70033* (2013.01); *G03F 7/70025* (2013.01)
(58) Field of Classification Search
USPC .................................................... 250/504 R
See application file for complete search history.

(56) References Cited

U.S. PATENT DOCUMENTS

| 2007/0158594 | A1* | 7/2007 | Shirai | .................. H05G 2/009 250/504 R |
| 2008/0029717 | A1* | 2/2008 | Shirai | .................. H05G 2/009 356/51 |
| 2022/0291597 | A1* | 9/2022 | Yabuta | ................ G03F 7/70916 |
| 2023/0324815 | A1* | 10/2023 | Yabuta | ................ G03F 7/70916 355/30 |

FOREIGN PATENT DOCUMENTS

| JP | 6075096 B2 | 8/2014 |
| JP | 6759732 B2 | 12/2017 |

* cited by examiner

*Primary Examiner* — Kiet T Nguyen
(74) *Attorney, Agent, or Firm* — Yoshida & Associates LLC; Kenichiro Yoshida

(57) ABSTRACT

A debris mitigation device includes a static foil trap. The static foil trap includes an enclosure section, a plurality of foils, an inlet hole, and a pressure-increasing mechanism. The enclosure section includes an incident opening where light emitted from the light source enters, an emission opening where the light is emitted, and an internal space where the light travels. The foils are fixed in an area of the internal space. The inlet hole is configured to be communicated with the internal space, and allow a transparent gas transparent to the light to flow into the internal space. The pressure-increasing mechanism includes at least one of an incident-side member and an emission-side member disposed at the incident opening and the emission opening, respectively, in a manner that opening areas thereof are reduced without blocking a traveling of the light, and increases a pressure of the internal space.

13 Claims, 16 Drawing Sheets

DEBRIS MITIGATION DEVICE AND LIGHT SOURCE APPARATUS INCLUDING THE SAME

CROSS-REFERENCE TO RELATED APPLICATION(S)

This application claims priority from Japanese Priority Patent Application No. 2022-102501 filed on Jun. 27, 2022. The entire teachings of the above application are incorporated herein by reference.

BACKGROUND ART

The present invention relates to a debris mitigation device and a light source apparatus including the same.

In recent years, a light source for exposure with a shorter wavelength has been developed as semiconductor integrated circuits are miniaturized and highly integrated. In particular, an extreme ultraviolet light source apparatus (hereinafter, occasionally referred to as "EUV light source apparatus") that emits extreme ultraviolet light (hereinafter, occasionally referred to as "EUV light") having a wavelength of 13.5 nm is being developed as a next-generation light source for semiconductor exposure systems.

Several methods are known to emit EUV light (EUV radiation) from EUV light source apparatuses. One such method involves a method of generating high-temperature plasma by heating and exciting an extreme ultraviolet emission seed (EUV emission seed) and extracting EUV light from the high-temperature plasma.

EUV light source apparatuses that employ such a method are categorized into a laser-produced plasma (LPP) type and a discharge-produced plasma (DPP) type, depending upon the method of generating high-temperature plasma.

A DPP-type EUV light source apparatus applies a high voltage across a pair of electrodes, between which a discharge gas containing an EUV emission seed (vaporized plasma raw material) has been supplied, to generate high-density plasma upon electric discharging, and uses extreme ultraviolet light emitted therefrom.

Japanese Patent No. 6075096 discloses a DPP-type light source apparatus. This light source apparatus involves supplying a surface of the electrodes, between which electric discharge is generated, with a liquid plasma raw material, for example, Sn (tin) or Li (lithium), that includes the extreme ultraviolet light emission seed, irradiating the raw material with an energy beam such as a laser beam for evaporation thereof, and then generating high-temperature plasma upon the electric discharging. This method is sometimes referred to as a laser-assisted discharge-produced plasma (LDP) method.

In contrast, an LPP-type EUV light source apparatus irradiates a target material with a laser beam to excite the target material and generate plasma.

EUV light source apparatuses, as described above, are used as light source apparatuses for semiconductor exposure systems (lithography systems) in manufacturing semiconductor devices. Alternatively, EUV light source apparatuses are used as light source apparatuses for mask inspection systems used in lithography. In other words, the EUV light source apparatuses are used as light source apparatuses for other optical systems (utilization equipment) that use EUV light.

Meanwhile, in the EUV light source apparatus, debris is released from the plasma. The debris includes particles of the plasma raw material (or particles of tin when the plasma raw material is tin). When plasma is generated in the apparatus of the DPP or LDP type, the debris may also contain particles of the material of discharge electrodes that have been sputtered due to the generation of plasma.

Upon reaching the utilization equipment, the debris may damage or contaminate the reflective film of optical elements in the utilization equipment, degrading its performance. Hence, a debris mitigation device (also referred to as debris mitigation tool (DMT)) has been proposed to capture the released debris in order to prevent it from entering the utilization equipment.

The debris mitigation device typically employs a foil trap. Japanese Patent No. 6075096 discloses a light source apparatus provided with a debris mitigation device employing a foil trap. This technology includes a foil trap with a rotation function (rotary foil trap) and a non-rotating, static foil trap (static foil trap).

The rotary foil trap includes a plurality of foils (thin films or thin flat plates) radially arranged around a rotation shaft disposed in the center and captures debris released from the plasma by rotating the plurality of the foils around the rotation shaft. Here, the rotation shaft is, for example, an axis approximately passing through the center of the plasma.

The static foil trap captures debris traveling at high speed (especially fast-moving ions, neutral atoms, and electrons, etc. originating from plasma raw material) that is unable to be captured by the rotary foil trap. The static foil trap includes a central shaft on the same axis as the rotation shaft of the rotary foil trap and a plurality of foils (thin films or thin flat plates) arranged radially from the central shaft.

The plurality of foils in the static foil trap divides the space in which they are arranged into smaller pieces, serving to lower the conductance and increase the pressure in the divided spaces. In other words, high-speed debris that is unable to be captured by the rotary foil trap decreases its velocity due to the increased collision probability in the area of increased pressure in the static foil trap, and is likely to be captured by the foils and a foil supporter in the static foil trap.

In addition, EUV light emitted from the EUV light source apparatus is appropriately shaped to suit the utilization equipment. For example, when the EUV light source apparatus is used as a light source apparatus for mask inspection systems, an aperture having an opening with a predetermined shape (corresponding to a heat shield plate described later) is disposed between hot plasma and the utilization equipment.

Japanese Patent No. 6759732 discloses a debris trap having an aperture. In this debris trap, a static foil trap is disposed on the principal ray of the EUV extraction light extracted from the aperture and has a shape corresponding to an area through which the EUV extraction light passes.

SUMMARY OF THE INVENTION

As mentioned above, the static foil trap captures fast-moving debris in areas where the pressure between the foils has increased. The probability of capturing the debris depends on the pressure between the foils. Accordingly, one of the aspects of the present invention is to provide a debris mitigation device capable of improving the probability of capturing debris and a light source apparatus including the debris mitigation device.

In view of the above circumstances, it is an object of the present technology to provide a debris mitigation device capable of improving the probability of capturing debris, and a light source apparatus including the debris mitigation device.

In order to achieve the above-mentioned purpose, a debris mitigation device according to an aspect of the present technology includes a static foil trap. The static foil trap includes an enclosure section, a plurality of foils, an inlet hole, and a pressure-increasing mechanism. The enclosure section includes an incident opening through which light emitted from the light source enters, an emission opening through which the light that has entered through the incident opening is emitted, and an internal space in which the light travels. The plurality of foils is fixed in an area of the internal space in which the light travels. The inlet hole is configured to be communicated with the internal space in the enclosure section, and allow a transparent gas transparent to the light to flow into the enclosure section. The pressure-increasing mechanism includes at least one of an incident-side member disposed at the incident opening in a manner that an opening area of the incident opening is reduced without blocking a traveling of the light, and an emission-side member disposed at the emission opening in a manner that an opening area of the emission opening is reduced without blocking the traveling of the light; and increases a pressure of the internal space.

In the debris mitigation device, a plurality of foils is disposed in the internal space of the enclosure section. In addition, the transparent gas flows into the internal space. Furthermore, the pressure-increasing mechanism that increases the pressure of the internal space is disposed. This makes it possible to improve the probability of capturing debris.

At least one of the incident-side member and the emission-side member may be a lid that is formed with a plate shape and that has an opening through which the light passes.

At least one of the incident-side member and the emission-side member may be a block member that is formed with a block shape, that has an opening through which the light passes, and that is disposed to fill the internal space.

The static foil trap may include an electromagnetic field generator that generates an electric field or a magnetic field that causes, of particles contained in the transparent gas, charged particles that are excited by the light to move in a direction away from the plurality of foils.

The internal space may include a buffer space in which the plurality of foils is absent. In this case, the inlet hole may be configured to be communicated with the buffer space.

The static foil trap may be disposed between the light source and utilization equipment that utilizes the light emitted from the light source, and between the light source and a monitoring device that monitors a state of the light emitted from the light source.

The light source may include plasma.

The debris mitigation device may further include a rotary foil trap. The rotary foil trap includes a cover member including an incident opening through which the light emitted from the light source enters, an emission opening through which the light that has entered is emitted, and an internal space in which the light travels; and a plurality of rotation foils rotatably mounted in an area of the internal space in which light travels.

The rotary foil trap may include a pressure-increasing mechanism including at least one of an incident-side member disposed at the incident opening in a manner that an opening area of the incident opening is reduced without blocking a traveling of the light, and an emission-side member disposed at the emission opening in a manner that an opening area of the emission opening is reduced without blocking the traveling of the light, and the pressure-increasing mechanism increasing a pressure of the internal space.

The static foil trap and the rotary foil trap may be disposed such that the incident opening of the static foil trap and the emission opening of the rotary foil trap face each other. In this case, the debris mitigation device may further include a connection member connecting the emission opening of the rotary foil trap to the incident opening of the static foil trap.

The debris mitigation device may further include an aperture disposed between the light source and the rotary foil trap and has an opening through which part of the light emitted from the light source is extracted.

A light source apparatus according to an aspect of the present technology includes a debris mitigation device including a plasma generation chamber in which a raw material that is to emit light is made to be excited to generate plasma, a light extraction section in which light that has been emitted from the plasma is extracted, and a static foil trap.

The debris mitigation device may further include a rotary foil trap.

Effect of the Invention

The present invention is capable of improving the probability of capturing debris. The effects described herein are not necessarily limited thereto but may be any of the effects described in this disclosure.

DETAILED DESCRIPTION OF THE EMBODIMENTS

Hereinafter, embodiments according to the present technology will be described with reference to the accompanying drawings.

Light Source Apparatus

Figure 1:
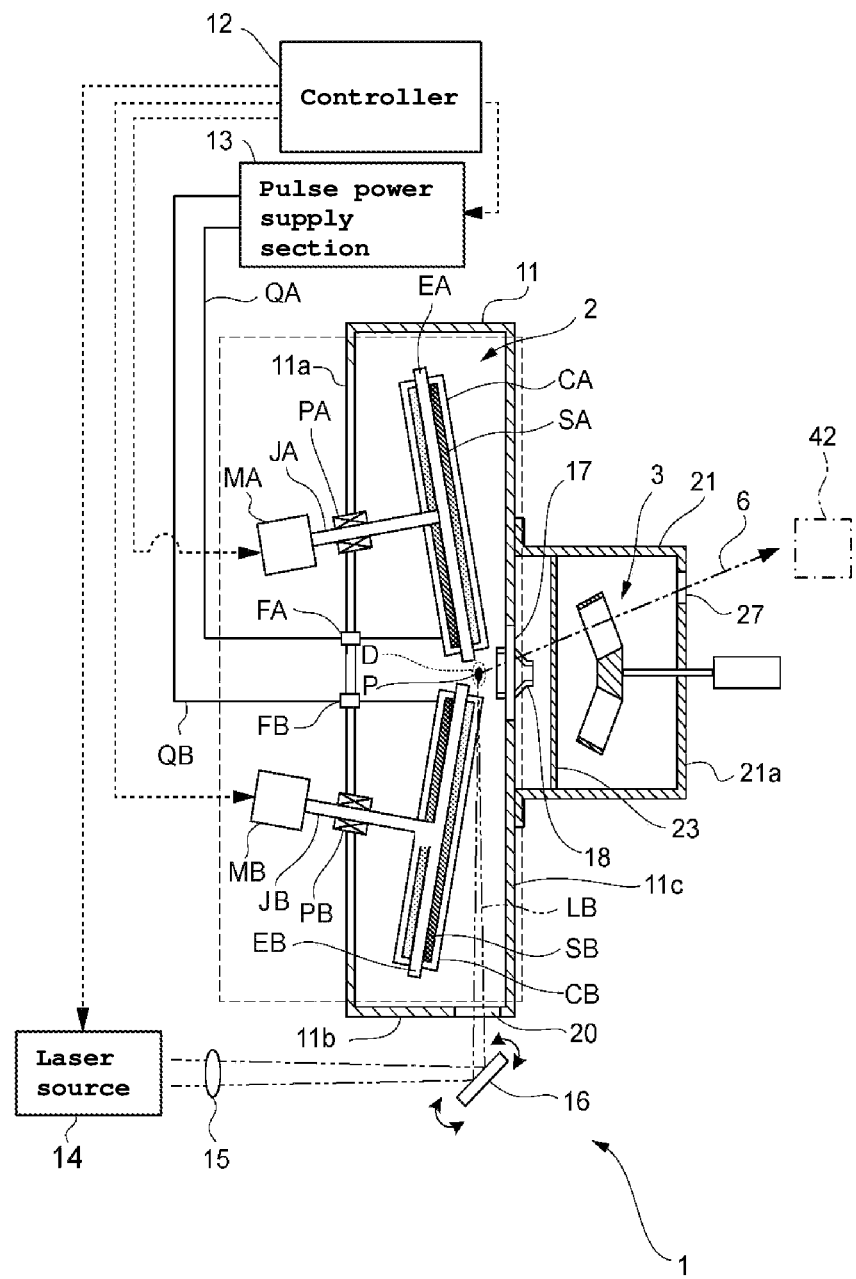
FIG. 1 is a schematic view illustrating a configuration example of a light source apparatus according to an embodiment of the present technology.
Figure 2:
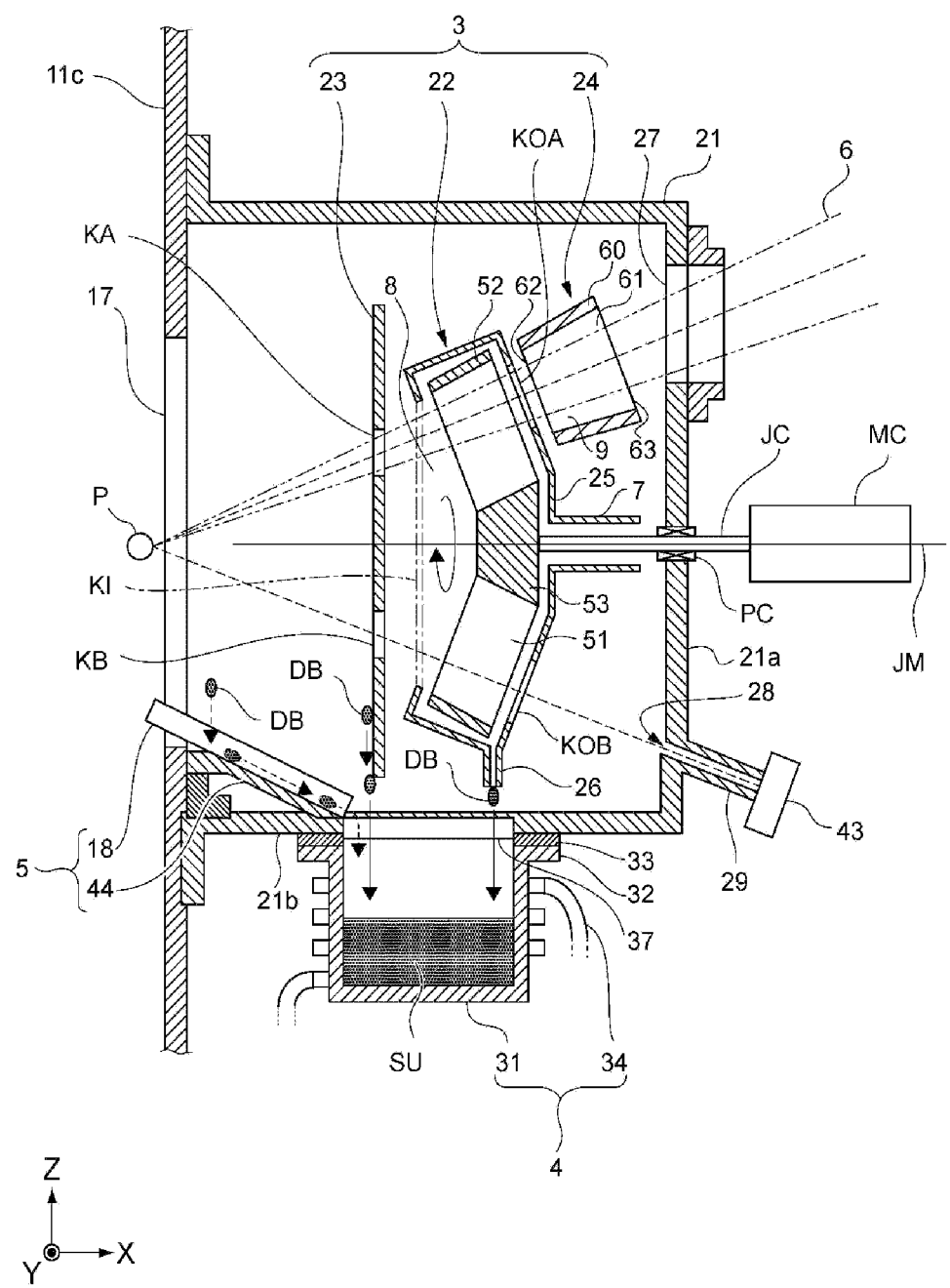
FIG. 2 is a schematic view illustrating a configuration example of a light source apparatus according to an embodiment of the present technology.

FIGS. 1 and 2 are schematic views illustrating configuration examples of a light source apparatus. FIG. 1 is a view illustrating a schematic cross-section of a light source apparatus 1 when cut along the horizontal direction at a predetermined height from the installation surface, and viewed from the positive side in the Z direction. Hereinafter, the description will be given using the X direction as the left-right direction (the positive side of the X axis is the right side and the negative side is the left side), the Y direction as the depth direction (the positive side of the Y axis is the front side and the negative side is the rear side), and the Z direction as the up-down direction (the positive side of the Z axis is the upper side and the negative side is the lower side). Obviously, the application of the present technology is not limited to the direction in which the light source apparatus 1 is employed.

FIG. 2 is a schematic view illustrating a portion of a debris mitigation device 3 of the light source apparatus 1. FIG. 2 illustrates a cross-section of the light source apparatus 1 when cut in the XZ plane, and viewed from the front side.

The light source apparatus 1 is an LDP-type EUV light source apparatus, and emits extreme ultraviolet (EUV) light. The light source apparatus 1 can be employed, for example, as a light source apparatus for a lithography system in semiconductor device manufacturing or a light source apparatus for a mask inspection system used in lithography. For example, when the light source apparatus 1 is employed as a light source apparatus for a mask inspection system, part of the EUV light emitted from the plasma is extracted and guided to the mask inspection system. The mask inspection system then uses the EUV light emitted from the light source apparatus 1 as inspection light to perform mask blank inspection or pattern inspection.

The light source apparatus 1 includes a light source section 2, the debris mitigation device 3, a debris receiving section 4, a debris guiding section 5, a controller 12, a pulse power supply section 13, a laser source 14, a focusing lens 15, a movable mirror 16, and a connection chamber 21.

Light Source Section

The light source section 2 includes a chamber 11, containers CA and CB, discharge electrodes EA and EB, and motors MA and MB. FIG. 1 illustrates the light source section 2 as a dashed rectangle.

The chamber 11 is an enclosure that accommodates the various mechanisms of the light source section 2. In the present embodiment, the chamber 11 has a rectangular parallelepiped shape. The chamber 11 is made of a rigid body, such as metal, for example. Obviously, the specific shape and material of the chamber 11 are not limiting.

The inside of the chamber 11 is maintained in a reduced-pressure atmosphere at a predetermined pressure or lower by a vacuum pump, which is not shown in the figure. Feedthroughs FA and FB are disposed on a left-side side wall 11a of the chamber 11. The feedthroughs FA and FB are seal members that enable electric wires and the like to be inserted into the chamber 11 while maintaining the reduced-pressure atmosphere inside the chamber 11.

A transparent window 20 is disposed in a front-side side wall 11b of the chamber 11. A first window section 17 that serves as a through-hole is disposed in a right-side side wall 11c of the chamber 11. In the present embodiment, the transparent window 20 is made of a material transparent to the laser beam. The specific configurations including the shape of the first window section 17 and the material and shape of the transparent window 20 are not limiting.

The containers CA and CB are containers for storing plasma raw material. In the present embodiment, the containers CA and CB are made of conductive materials. The container CA stores plasma raw material SA. The container CB stores plasma raw material SB. The plasma raw materials SA and SB are heated liquid-phase raw materials. In the present embodiment, tin (Sn) is used as the plasma raw materials SA and SB. Alternatively, other raw materials that can generate plasma, such as lithium (Li), may be used.

The discharge electrodes EA and EB have a disc shape. The discharge electrodes EA and EB are made of high-melting-point metals such as molybdenum (Mo), tungsten (W), or tantalum (Ta), for example. The specific materials of the discharge electrodes EA and EB are not limiting.

For example, the discharge electrode EA is used as a cathode and the discharge electrode EB is used as an anode. The discharge electrodes EA and EB are spaced apart from each other. In addition, the discharge electrodes EA and EB are arranged such that a part of the circumferential edges of the discharge electrodes EA and EB are in close proximity to each other. The gap at a position where the circumferential edges of the discharge electrodes EA and EB are closest to each other serves as a discharge region D by the discharge electrodes EA and EB.

The discharge electrode EA is disposed such that the lower part of the discharge electrode EA (rear side in FIG. 1) is immersed in the plasma raw material SA stored in the container CA. Similarly, the discharge electrode EB is disposed such that the lower part of the discharge electrode EB is immersed in the plasma raw material SB.

The motor MA rotates the discharge electrode EA. The motor MA includes a rotation shaft JA. The base section of the motor MA is located outside the left side of the chamber 11, and the rotation shaft JA connected to the base section extends from the outside of the chamber 11 to the inside thereof. The end of the rotation shaft JA located inside the chamber 11 is connected to the center of the discharge electrode EA (the center of the circular surface).

The gap between the rotation shaft JA and the wall of the chamber 11 is sealed with a seal member PA. A mechanical seal is used as the seal member PA, for example. The seal member PA rotatably supports the rotation shaft JA while maintaining a reduced-pressure atmosphere in the chamber 11.

Similarly, the motor MB includes a rotation shaft JB, which is connected to the center of the discharge electrode EB. The gap between the rotation shaft JB and the wall of the chamber 11 is sealed by a seal member PB.

The discharge electrodes EA and EB are arranged such that their respective axes (direction of the extension of the rotation axis) are not parallel. Specifically, as shown in FIG. 1, the discharge electrode EA is disposed with its front side (lower side of FIG. 1) tilted to the right and its rear side (upper side of FIG. 1) tilted to the left. In contrast, the discharge electrode EB is disposed with its front side tilted to the left and its rear side tilted to the right. The intervals between the rotation shafts JA and JB in the depth direction (up-down direction, Y direction in FIG. 1) are also narrower on the side where the motors MA and MB are disposed and wider on the side where the discharge electrodes EA and EB are disposed. Furthermore, the discharge electrode EB, the motor MB, and the rotation shaft JB are positioned slightly to the left of the discharge electrode EA, the motor MA, and the rotation shaft JA, respectively.

The light source section 2 corresponds to one embodiment of a plasma generation chamber according to the present embodiment.

A controller 12 controls the operation of each section of the light source apparatus 1. For example, the controller 12 controls the rotation drive of the motors MA and MB, which rotate the discharge electrodes EA and EB respectively at a predetermined rotation speed. In addition, the controller 12 controls the operation of the pulse power supply section 13 and the timing of irradiation of the laser beam from the laser source 14, for example.

For example, the controller 12 is constituted by a controller including processors such as CPUs, GPUs, and DSPs, memory such as ROMs and RAMs, memory devices such as HDDs, and other hardware necessary for computer configuration. Specifically, the CPU in the controller executing programs (e.g., application programs) according to the present technology enables the controller 12 to serve as a functional block.

The pulse power supply section 13 supplies the discharge electrodes EA and EB with pulse power to generate a discharge in the discharge region D. The pulse power supply section 13 is connected to power feed lines QA and QB. The power feed line QA is inserted into the chamber 11 via the feedthrough FA and is connected to the container CA. The power feed line QB is inserted into the chamber 11 via the feedthrough FB and is connected to the container CB.

The laser source 14 irradiates the plasma raw materials SA and SB with an energy beam to vaporize them. The laser source 14 is disposed outside the chamber 11. The laser source 14 is, for example, a Nd:YVO$_4$ (Neodymium-doped Yttrium Orthovanadate) laser system. In this case, the laser source 14 emits a laser beam LB in the infrared region having a wavelength of 1064 nm. However, the specific configurations of the laser source 14, such as the type of device of the laser source 14 and the wavelength of the laser beam LB to be irradiated, are not limiting, as long as it is possible to vaporize the plasma raw materials SA and SB.

The focusing lens 15 is located on the optical path of the laser beam LB, and outside the chamber 11. The spot diameter of the laser beam LB is adjusted when the laser beam LB that has been emitted by the laser source 14 enters the focusing lens 15.

The movable mirror 16 is located on the optical path of the laser beam LB, and outside the chamber 11. The movable mirror 16 is disposed behind the focusing lens 15 on the optical path of the laser beam LB. In other words, the laser beam LB that has passed through the focusing lens 15 is incident onto the movable mirror 16.

The laser beam LB incident onto the movable mirror 16 is reflected by the movable mirror 16 and passes through the transparent window 20 in the chamber 11. The laser beam LB then reaches the circumferential edge of the discharge electrode EA in the vicinity of the discharge region D inside the chamber 11. Changing the posture of the movable mirror 16 enables the adjustment of the irradiation position of the laser beam LB with respect to the discharge electrode EA.

The connection chamber 21 is an enclosure that accommodates the debris mitigation device 3 and other mechanisms. The connection chamber 21 has a rectangular parallelepiped shape, and one of its six faces is entirely a rectangular opening. The connection chamber 21 is connected to the chamber 11 such that the frame constituting the opening is in contact with the right-side side wall 11c of the chamber 11.

The connection chamber 21 is made of a rigid body, such as metal, for example. Obviously, the specific shape and material of the connection chamber 21 are not limiting. The inside of the connection chamber 21 is maintained in a reduced-pressure atmosphere at a predetermined pressure or lower.

A second window section 27 is disposed at the upper part of a right-side side wall 21a of the connection chamber 21. The second window section 27 is a through-hole with a predetermined shape. An EUV light guiding hole 28 is disposed at the lower part of the right-side side wall 21a. In addition, a guide tube 29 is disposed to extend from the EUV light guide hole 28 toward the lower-right side. Furthermore, an opening 37 is configured in a lower-side side wall 21b for connecting the debris receiving section 4.

Operation of the Light Source Section

The light source section 2 excites raw materials that are to emit light (plasma raw materials SA and SB) to generate plasma P. The light source section 2 also generates EUV light 6 using the plasma P as a light-emitting point. Hereinafter, the specific details of the generation of the plasma P and the EUV light 6 by the light source section 2 will be described.

First, the controller 12 controls the operation of the pulse power supply section 13, and the pulse power supply section 13 supplies the container CA with pulse power. The pulse power is supplied via the power feed line QA.

The container CA is made of conductive material. The container CA stores the plasma raw material SA, and the lower part of the discharge electrode EA is immersed in the plasma raw material SA. Accordingly, the pulse power supply section 13, the container CA, the plasma raw material SA, and the discharge electrode EA are electrically connected to each other. In other words, the pulse power supply section 13 supplies the discharge electrode EA with pulse power. Similarly, the pulse power supply section 13 supplies the discharge electrode EB with pulse power.

The controller 12 controls the rotation drive of the motor MA, which rotates the discharge electrode EA. With the rotation of the discharge electrode EA, the plasma raw material SA is transported to the vicinity of the discharge region D in a state of adhering to the front surface of the discharge electrode EA. Similarly, the plasma raw material SB is transported to the vicinity of the discharge region D in a state of adhering to the front surface of the discharge electrode EB.

The controller 12 also controls the operation of the laser source 14, and the laser source 14 emits the laser beam LB. The laser beam LB is emitted in a rightward direction and reaches the movable mirror 16 through the focusing lens 15. Furthermore, the laser beam LB is reflected by the movable mirror 16 to the rear side (upper side in FIG. 1), travels the inside of the chamber 11 through the transparent window 20, and reaches the circumferential edge of the discharge electrode EA in the vicinity of the discharge region D.

The discharge electrode EB is disposed with its front side (lower side in FIG. 1) tilted to the left. In addition, the discharge electrode EB is also disposed slightly to the left of the discharge electrode EA. Hence, the optical path of the laser beam LB is not blocked by the discharge electrode EB. Arranging the discharge electrode EB in this manner easily enables the irradiation of the discharge electrode EA with the laser beam LB.

The plasma raw material SA that has been transported to the vicinity of the discharge region D by the discharge electrode EA is vaporized by the irradiation of the laser beam LB and becomes gas-phase plasma raw material SA in the discharge area D. Similarly, the plasma raw material SB also becomes gas-phase plasma raw material SB in the discharge region D.

Supplying the discharge electrodes EA and EB with pulse power causes a discharge between the discharge electrodes EA and EB (discharge area D). The discharge heats and excites the gas-phase plasma raw materials SA and SB in the discharge region D by the electric current, generating the plasma P.

Then, the plasma P emits the EUV light 6. Part of the emitted EUV light 6 (light in a rightward direction) passes through the first window section 17 and enters the inside of the connection chamber 21. FIG. 1 illustrates an example of the optical path of the EUV light 6 passing through the first window section 17 with a double-dotted arrow. The plasma P corresponds to one embodiment of a light source according to the present technology.

In the present embodiment, the inside of the chamber 11 and the connection chamber 21 is maintained in a reduced-pressure atmosphere at a predetermined pressure or lower. This makes it possible to favorably generate a discharge for heating and exciting the plasma raw materials SA and SB. It is also possible to suppress the attenuation of the EUV light 6.

The plasma P releases debris DB at high speed in various directions together with the EUV light 6. The debris DB includes tin particles originating from the plasma raw materials SA and SB. The debris DB also includes particles originating from the materials of the discharge electrodes EA and EB, which are sputtered due to the generation of the plasma P. Specifically, the debris DB includes fast-moving ions, neutral atoms, and electrons. This debris DB gains significant kinetic energy through the contraction and expansion processes of the plasma P. Part of the debris DB passes through the first window section 17 and is released inside of the connection chamber 21.

Debris Mitigation Device

The debris mitigation device 3 captures the debris DB released from the plasma P. The debris mitigation device 3 includes a rotary foil trap 22, a heat shield plate 23, and a static foil trap 24. All of these components are disposed inside the connection chamber 21.

The heat shield plate 23 is a plate member and is disposed parallel to the YZ plane. The heat shield plate 23 is disposed between the plasma P and the rotary foil trap 22. An opening KA is configured in the upper part of the heat shield plate 23. An opening KB is configured in the lower part of the heat shield plate 23. The EUV light 6 emitted from the plasma P enters the left-side face of the heat shield plate 23 and passes through the openings KA and KB. Hence, the shape of the EUV light 6 emitted on the right side of the heat shield plate 23 is shaped in accordance with the shape of the openings KA and KB.

In this way, part of the EUV light 6 emitted from the plasma P is extracted by the openings KA and KB. The shape of the openings KA and KB are appropriately set to, for example, a circular shape or the like in accordance with the shape of the EUV light 6 that is desired to be extracted. Obviously, the specific shapes of the openings KA and KB are not limiting.

The heat shield plate 23 is made of a high-melting-point metal, such as tungsten (W) or molybdenum (Mo), for example. The specific configurations of the heat shield plate 23 including material and shape are not limiting. The heat shield plate 23 corresponds to one embodiment of an aperture according to the present technology.

Figure 3:
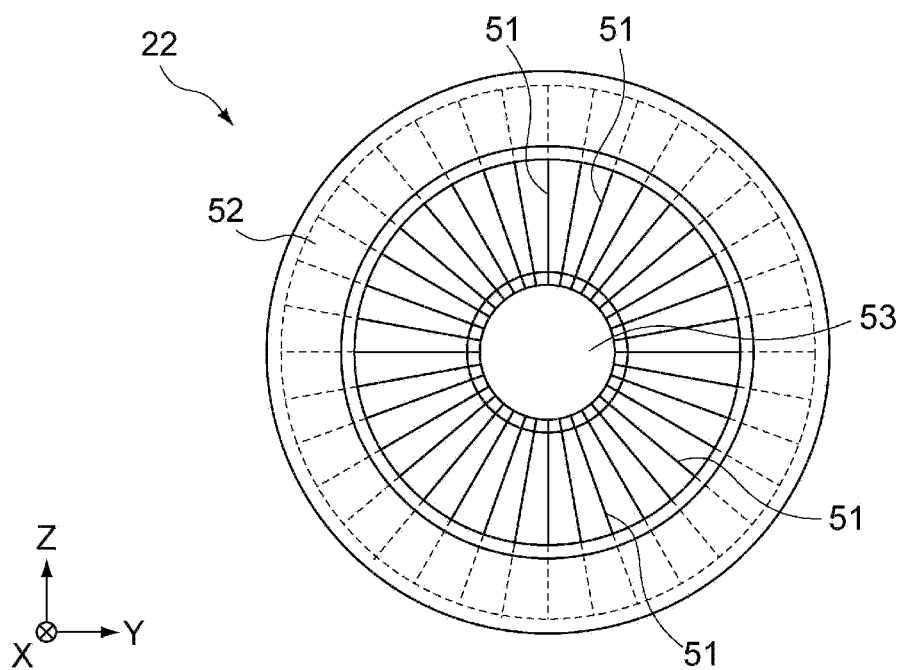
FIG. 3 is a schematic view illustrating a configuration example of a rotary foil trap.

The rotary foil trap 22 captures the debris DB released from the plasma P. The rotary foil trap 22 includes a cover 25, a plurality of rotation foils 51, an outer ring 52, a central pillar 53, and a motor MC. FIG. 3 is a schematic view illustrating a configuration example of the rotary foil trap 22. FIG. 3 illustrates, of the rotary foil trap 22, the plurality of rotation foils 51, the outer ring 52, and the central pillar 53 when viewed from the left side (incident side of the EUV light 6) in FIGS. 1 and 2.

The outer ring 52 is a member having a ring shape. The outer ring 52 is disposed to be concentric with the central pillar 53. The rotation foils 51 are thin films or thin flat plates. The individual rotation foils 51 are disposed between the outer ring 52 and the central pillar 53. The individual rotation foils 51 are arranged radially with nearly equal angular intervals with respect to the central pillar 53. Hence, each rotation foil 51 is located on a plane containing a central axis JM of the central pillar 53. The position of each of the rotation foils 51, the outer ring 52, and the central pillar 53 is configured to protrude to the right side of FIGS. 1 and 2 (the rear side of FIG. 3) from the outer periphery to the center.

The rotation foil 51, the outer ring 52, and the central pillar 53 are made of a high-melting-point metal such as tungsten or molybdenum. The materials and other specific configurations of the rotation foil 51, the outer ring 52, and the central pillar 53 are not limiting.

The motor MC rotates the rotation foil 51, the outer ring 52, and the central pillar 53. The motor MC includes a rotation shaft JC. The base section of the motor MC is disposed outside the right side of the connection chamber 21, and the rotation shaft JC connected to the base section extends from the outside of the connection chamber 21 to the inside thereof. The end of the rotation shaft JC located inside the connection chamber 21 is connected to the center of the right-side face of the central pillar 53.

The gap between the rotation shaft JC and the wall of the connection chamber 21 is sealed with a seal member PC. The seal member PC rotatably supports the rotation shaft JC while maintaining a reduced-pressure atmosphere in the connection chamber 21.

The central axis JM of the central pillar 53 coincides with the central axis of the rotation shaft JC. In other words, the rotation shaft JC can be regarded as the rotation axis of the rotation foils 51, the outer ring 52, and the central pillar 53. The rotation foils 51, the outer ring 52, and the central pillar 53 rotate integrally by the drive of the motor MC.

The cover 25 is a member that surrounds the rotation foils 51, the outer ring 52, and the central pillar 53. In the present embodiment, the cover 25 generally has a shape similar to the rotation foils 51, the outer ring 52, and the central pillar 53.

The cover 25 has an internal space 8, and the rotation foils 51, the outer ring 52, and the central pillar 53 are disposed in the internal space 8. A through-hole 7 protruding to the right is configured in the center of the right-side face of the cover 25, and the rotation shaft JC of the motor MC is inserted into the through-hole 7. An exhaust pipe 26 projecting to the lower side is provided in the lower part of the cover 25.

An opening KI is configured in the left-side face of the cover 25. The opening KI is configured over approximately the entire left-side face. An opening KOA is configured in the upper part of the right-side face of the cover 25. An opening KOB is configured in the lower part of the right-side face of the cover 25.

The openings KI, KOA, and KOB all have a shape that does not block the traveling of light 6. FIG. 2 illustrates an area through which the EUV light 6 travels as dashed lines. The shapes of the openings KI, KOA, and KOB include areas through which the EUV light 6 travels. In other words, the EUV light 6 passes through the opening KI, travels through the internal space 8 of the cover 25, passes through the openings KOA and KOB, and travels to the outside of the rotary foil trap 22; however, the traveling EUV light 6 is not blocked by the cover 25.

The specific shapes of the openings KI, KOA, and KOB are not limiting. The opening KI corresponds to one embodiment of an incident opening of the cover according to the present technology. The openings KOA and KOB correspond to one embodiment of emission openings of the cover according to the present technology.

Figure 4:
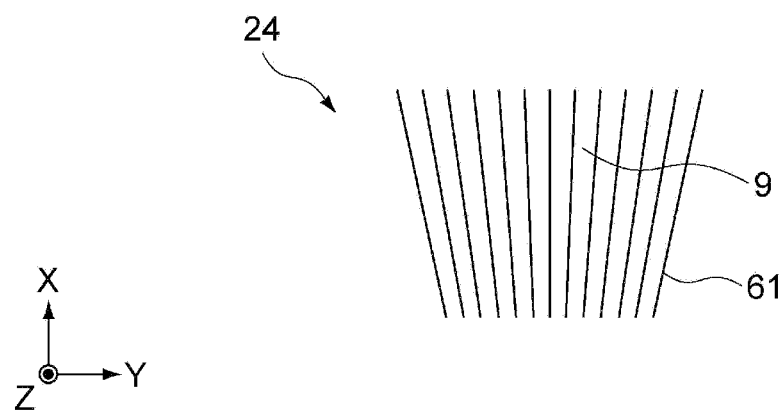
FIG. 4 is a schematic view illustrating a configuration example of a static foil trap according to a reference example.
Figure 5:
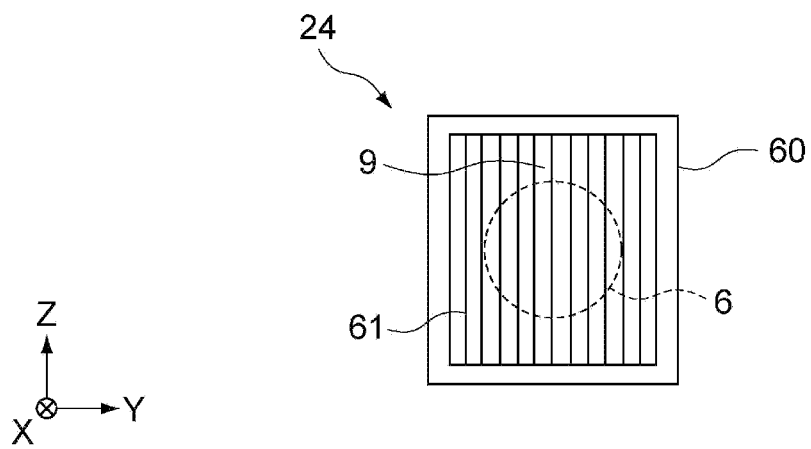
FIG. 5 is a schematic view illustrating a configuration example of a static foil trap according to a reference example.

FIGS. 4 and 5 are schematic views illustrating configuration examples of the static foil trap 24 of the reference example. The static foil trap 24 of the present technology will be described later in the first embodiment.

FIG. 4 illustrates the static foil trap 24 viewed from the positive side in the Z direction (upper side of FIG. 2). In FIG. 4, an enclosure section 60 is omitted. FIG. 5 illustrates a cross-section of the static foil trap 24 when cut in the YZ plane, viewed from the negative side in the X direction (left side of FIG. 2). In FIG. 2, the static foil trap 24 is disposed in a slightly tilted position; however, for ease of understanding of the description, in FIG. 4 and the static foil trap 24 is assumed not to be tilted with respect to the X, Y, and Z directions.

The static foil trap 24 includes the enclosure section and a plurality of foils 61. The enclosure section 60 has a rectangular parallelepiped shape. A rectangular-shaped incident opening 62 is configured in the left-side face of the enclosure section 60. A rectangular-shaped emission opening 63 is configured in the right-side face of the enclosure section 60. The enclosure section 60 has an internal space 9 as a space enclosed by the four faces such as a front-side face, a rear-side face, an upper-side face, and a lower-side face (right-side face, left-side face, upper-side face, and lower-side face in FIG. 6).

The static foil trap 24 is disposed at a position at which the opening KOA of the rotary foil trap 22 and the incident opening 62 of the static foil trap 24 face each other. The specific configurations of the enclosure section including shape and material, are not limiting.

The plurality of foils 61 is a thin film or thin flat plate. Each of the foils 61 is disposed in the internal space 9 of the enclosure section 60. Each of the foils 61 is disposed at an equal interval in the Y direction. As shown in FIG. 4, the individual foils 61 is disposed radially to increase the interval between the foils 61 when moving toward the positive side in the X direction. In other words, the foil 61 located at the center is disposed parallel to the XZ plane, and the other foils 61 are slightly tilted in the Y direction. The upper-side side and the lower-side side of the foils 61 (the front-side side and the rear-side side in FIG. 4) are fixed to the inner-side face of the enclosure section 60.

The foil 61 is made of a high-melting-point metal such as tungsten or molybdenum, for example. The specific configurations of the foils 61, including the material, number, and arrangement thereof, are not limiting.

The debris receiving section 4 is a container for storing the debris DB. The debris receiving section 4 includes a debris storage container 31 and a heater wiring 34. The debris storage container 31 has a rectangular parallelepiped shape. The debris storage container 31 has a rectangular-shaped opening that is enclosed by a flange 32 in the upper-side face of the debris storage container 31. The debris storage container 31 is connected to the connection chamber 21 such that the flange 32 overlaps the opening 37 of the connection chamber 21. Specifically, the flange 32 is fixed to the connection chamber 21 by screwing. The gap between the flange 32 and the connection chamber 21 is sealed with a gasket 33. Obviously, specific configurations including the material and shape of the debris storage container 31 and the method of connection to the connection chamber 21, are not limiting.

The heater wiring 34 heats the debris storage container 31. In the present embodiment, the heater wiring 34 is wrapped around the debris storage container 31. However, it is not limiting; other heating means may be embedded in the debris storage container 31.

The debris guiding section 5 guides the debris DB into the debris receiving section 4. The debris guiding section 5 includes a receiving plate 18 and a support base 44. The support base 44 is configured in the lower left corner inside the connection chamber 21, with a tilt to the lower-right side.

The receiving plate 18 is a member serving as a receiving plate for the debris DB. The receiving plate 18 is disposed on the support base 44. The receiving plate 18 has a rectangular shape. The receiving plate 18 is disposed such that its left-side side protrudes slightly into the chamber 11 through the first window section 17. The receiving plate 18 is disposed such that its right-side side is located in the vicinity of the opening 37. The specific configurations of the receiving plate 18, such as shape and material, are not limiting.

Traveling of light emitted from the EUV light source Hereinafter, the traveling of the EUV light 6 emitted from the light source section 2 will be described. The EUV light 6 emitted from the plasma P in the light source section 2 passes through the first window section 17 and travels into the inside of the connection chamber 21. The EUV light 6 first reaches the heat shield plate 23. Part of the traveling EUV light 6 is blocked by the heat shield plate 23, and part thereof passes through the openings KA and KB. Hence, the EUV light 6 is emitted on the right side of the heat shield plate 23 with a shape corresponding to the shapes of the openings KA and KB.

The EUV light 6 then enters the rotary foil trap 22 through the opening KI of the cover 25. In the internal space 8 of the cover 25, the plurality of rotation foils 51 are rotatably mounted with respect to the area of the internal space 8 where the EUV light 6 travels. In other words, the plurality of rotation foils 51 rotate in the area where the EUV light 6 travels. For example, the rotation foils 51 are rotated by the drive of the motor MC that is controlled by the controller 12.

Each of the rotation foils 51 is disposed parallel to the traveling direction of the EUV light 6. Hence, the EUV light 6 is blocked only by the thickness of the rotation foils 51, and most of the EUV light 6 is emitted outside the rotary foil trap 22. This arrangement configuration of the rotation foils 51 makes it possible to maximize the proportion (also called transmittance) of the EUV light 6 passing through the rotary foil trap 22.

The EUV light 6 emitted from the opening KOA to the outside of the rotary foil trap 22 enters the incident opening 62 of the static foil trap 24. It then travels through the internal space 9 of the enclosure section 60. In the internal space 9, the plurality of foils 61 is fixed in an area where the EUV light 6 travels in the internal space 9.

Each of the foils 61 is disposed parallel to the traveling direction of the EUV light 6. Hence, the EUV light 6 is blocked only by the thickness of the foils 61, and most of the EUV light 6 is emitted outside the static foil trap 24.

The EUV light 6 emitted from the emission opening 63 of the static foil trap 24 passes through the second window section 27 and is emitted toward utilization equipment 42. The utilization equipment 42 is an apparatus that utilizes the EUV light 6. In other words, when the overall operation of the light source apparatus 1 is considered, it can be said that light emitted from the plasma P is extracted by the second window section 27 and utilized by the utilization equipment 42. The second window section 27 corresponds to one embodiment of a light extraction section according to the present embodiment.

Meanwhile, the EUV light 6 that has passed through the opening KB passes through the lower part of the rotary foil trap 22 and is emitted from the opening KOB. Furthermore, the EUV light 6 enters the EUV light guide hole 28 and passes through the inside of the guide tube 29.

A monitoring device 43 is provided at the exit of the guide tube 29. The monitoring device 43 is a detector that detects the EUV light 6 or a measuring instrument that measures the intensity of the EUV light 6. The emission intensity and the emission timing of the EUV light 6 may be controlled, based on the monitoring results by the monitoring device 43, for example.

Debris Capture

The following will describe the specific content of the capture of debris DB by the debris mitigation device 3. The plasma P releases the debris DB together with the EUV light 6. The debris DB is released in various directions, and part of it passes through the first window section 17 and enters the inside of the connection chamber 21.

A part of the debris DB that has entered the inside of the connection chamber 21 is deposited on the left-side face of the heat shield plate 23. The debris DB deposited on the heat shield plate 23 melts due to radiation from the plasma P. When the melted debris reaches a certain amount, it becomes droplets, moving to the lower part of the heat shield plate 23 by gravity. The debris DB then detaches from the heat shield plate 23 and is stored in the debris storage container 31 located below the heat shield plate 23. FIG. 2 schematically illustrates a view of the debris DB that has become a droplet on the heat shield plate 23 flowing into the debris storage container 31.

Disposing the heat shield plate 23 reduces the amount of the debris DB that proceeds to the rotary foil trap 22. This reduces the load on the rotary foil trap 22. In addition, the heat shield plate 23 suppresses heat conduction from the plasma P to the rotary foil trap 22 or other components, preventing the overheating of the rotary foil trap 22 or other components. Since the heat shield plate 23 is made of a high-melting-point material, it is deformed less by the heat of the plasma P.

Meanwhile, part of the debris DB passes through the openings KA and KB and travels to the right side of the heat shield plate 23, and enters the rotary foil trap 22. Since the rotation foils 51 rotate in the rotary foil trap 22, the rotation foils 51 actively collides with the debris DB. As a result, the debris DB is captured by the rotation foils 51.

The debris DB that has been captured by the rotation foils 51 moves along the radial direction on the rotation foil 51 by centrifugal force, detaches from the end of the rotation foils 51, and adheres to the inner surface of the cover 25. The cover 25 that surrounds the rotation foils 51 prevents the debris DB from scattering into the connection chamber 21.

The cover 25 is heated by heating means (not shown). Alternatively, it is heated by secondary radiation from the heat shield plate 23 that receives EUV radiation. Heating the cover 25 allows the debris DB adhering to the inner surface of the cover 25 not to solidify, remaining in the liquid phase. The debris DB adhering to the inner surface of the cover 25 moves to the lower part of the cover 25 by gravity, detaches from the lower part of the cover 25 via the exhaust pipe 26, and is stored in the debris storage container 31. FIG. 2 schematically illustrates a view of the debris DB exhausted from the exhaust pipe 26 flowing into the debris storage container 31.

The rotary foil trap 22 captures debris DB traveling at a relatively low speed. Accordingly, debris DB traveling at high speed may not be captured by the rotary foil trap 22 and may pass through the opening KOA and travel to the right side of the rotary foil trap 22. This debris DB enters the static foil trap 24 through the incident opening 62 and then collides with the foils 61. In this way, the debris DB traveling at high speed that is unable to be captured by the rotary foil trap 22 is captured by the static foil trap 24.

Recovery of Waste Material

Of the plasma raw material SA (tin) that adheres to the discharge electrode EA and is transported to the discharge region D, only a small amount of the plasma raw material SA is vaporized by the irradiation of the energy beam and used for the generation of the plasma P. Hence, most of the plasma raw material SA adhering to the discharge electrode EA is returned to the container CA unused; however, there may be a case in which part of it falls due to gravity and does not return to the container CA, and furthermore, due to some defect, part of the liquid-phase plasma raw material SA stored in the container CA may overflow from the container CA. Similarly, there may be a case in which part of the plasma raw material SB may overflow from the container CB.

The waste material falling in the direction of gravity is received by the receiving plate 18. The receiving plate 18 is heated by heating means not shown in the figure, and is maintained at a temperature above the melting point (about 232° C.) of tin, which is the waste material. Hence, the waste material moves along the receiving surface of the tilted receiving plate 18 in a liquid phase and flows into the debris storage container 31.

FIG. 2 is a schematic view illustrating the state in which the debris storage container 31 is filled with contents SU including the waste material and the debris DB. Since the waste material is tin and most of the debris DB is also tin, the debris storage container 31 can be called a tin collection container.

During the operation of the light source apparatus 1, the heater wiring 34 is supplied with power to heat the inside of the debris storage container 31 at a temperature above the melting point of tin. Hence, the tin stored inside the debris storage container 31 is in a liquid phase.

Tin solidifying inside the debris storage container 31 causes the accumulated materials located at points where debris DB is likely to fall in the debris storage container 31, to accumulate in a manner that stalagmites in a stalactite cave grow. When the accumulation of debris DB grows like a stalagmite, for example, the exhaust pipe 26 of the cover 25 may be blocked by the debris DB, thus the debris DB accumulates inside the cover 25. Furthermore, the debris DB accumulated inside the cover 25 may come into contact with the rotary foil trap 22, interfering with the rotation of the rotary foil trap 22 or damaging the rotary foil trap 22.

Alternatively, part of the openings KOA and KOB provided in the cover 25 may be blocked by the debris DB accumulated in the cover 25, blocking the traveling of the EUV light 6 at the openings KOA and KOB.

To address these issues described above, tin is maintained in a liquid phase by heating. This allows the tin to flatten in the debris storage container 31, storing the tin while preventing the growth of tin like a stalagmite.

When the tin stored in the debris storage container 31 is collected, the power supply to the heater wiring 34 is stopped and the heating of the inside of the debris storage container 31 is stopped. Then, the pressure inside the connection chamber 21 is returned to atmospheric pressure when the temperature of the debris storage container 31 returns to room temperature, and the stored tin solidifies. After that, the debris storage container 31 is detached from the connection chamber 21, and a new debris storage container 31 with no accumulated tin is attached to the connection chamber 21.

Although the tin inside the detached debris storage container 31 is in a solid phase, the tin can be removed from the debris storage container 31 by reheating the debris storage container 31 to make the tin a liquid phase again. In this way, the detached debris storage container 31 can be reused.

First Embodiment

With reference to FIGS. 6 through 12, more detailed embodiments of the light source apparatus 1 according to the present technology will be described. In the following description, the same parts of the configuration and action of the light source apparatus 1 described above will be omitted or simplified.

Static Foil Trap

Figure 6:
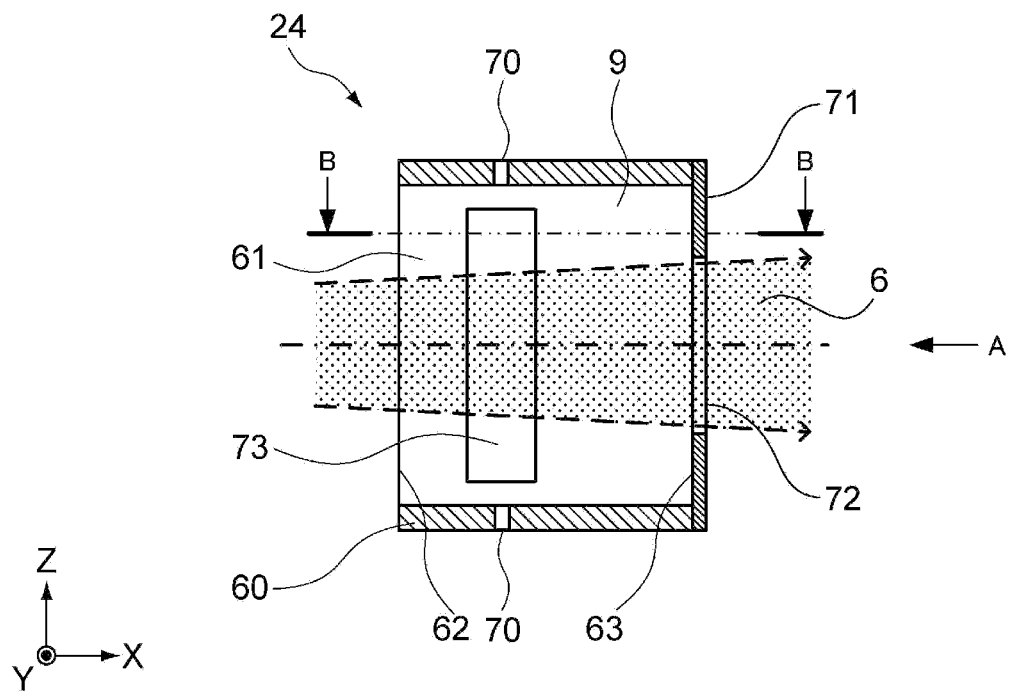
FIG. 6 is a schematic view illustrating a configuration example of a static foil trap.
Figure 7:
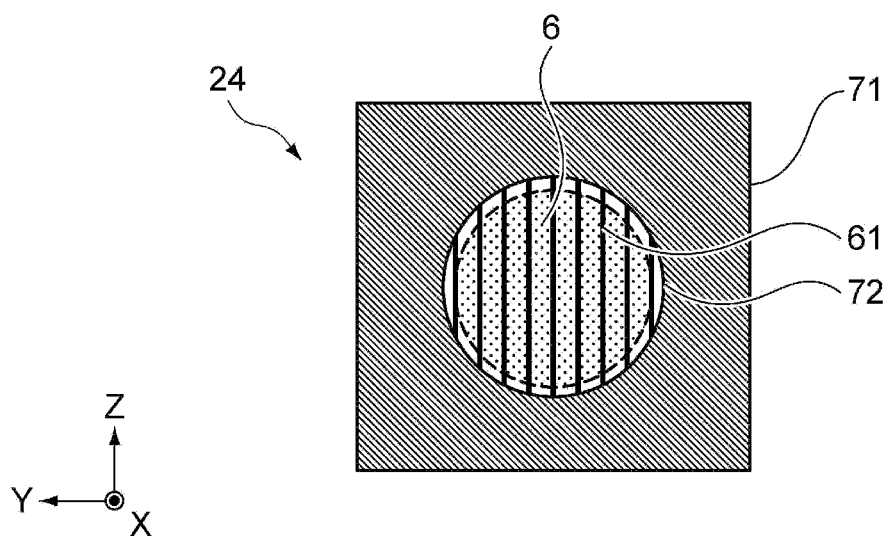
FIG. 7 is a schematic view illustrating a configuration example of a static foil trap.
Figure 8:
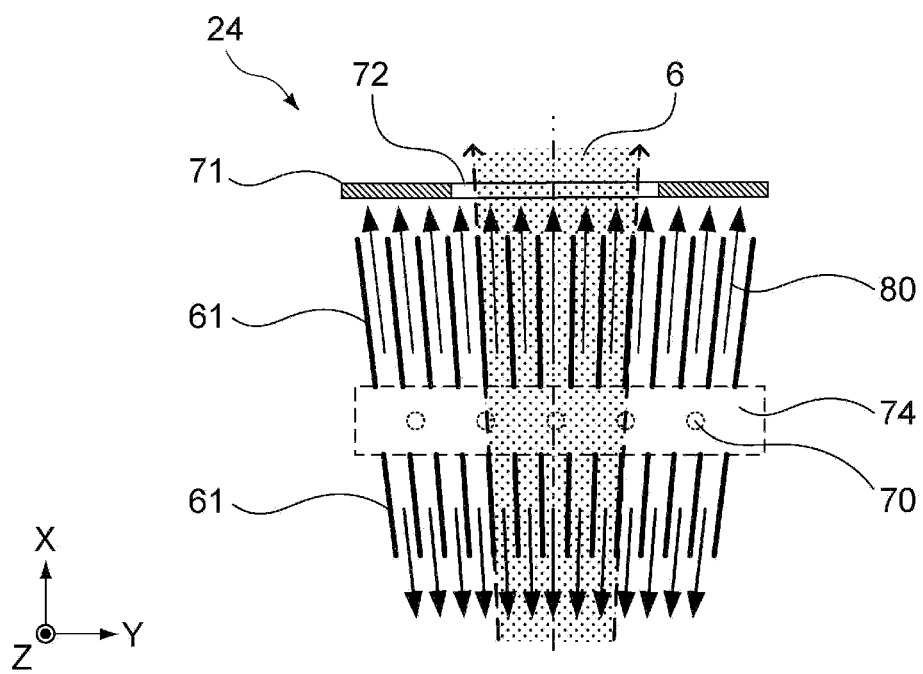
FIG. 8 is a schematic view illustrating a configuration example of a static foil trap.

Hereinafter, a more detailed configuration of the static foil trap 24 will be described. FIGS. 6 to 8 are schematic views illustrating configuration examples of the static foil trap 24. FIG. 6 illustrates a cross-section of the static foil trap 24 when cut in a plane parallel to the XZ plane, viewed from the front side of FIG. 2. FIG. 7 illustrates a view of the static foil trap 24, viewed from the direction of arrow A shown in FIG. 6. FIG. 8 illustrates a cross-section of the static foil trap 24 taken along line B-B of FIG. 6, viewed from the upper side. The enclosure section is not shown in FIG. 8.

The static foil trap 24 further includes an inlet hole and a pressure adjustment plate 71. The inlet hole 70 is a hole that allows gas to be introduced into the internal space 9 in the static foil trap 24. The inlet hole 70 is configured to be connected to the internal space 9 of the enclosure section 60. Specifically, five inlet holes 70 are arranged on each of the upper surface (front-side face of FIG. 8) and the lower surface (rear-side face of FIG. 8) of the enclosure section 60, at positions slightly left side (lower side of FIG. 8) from the center of the enclosure section 60, with equal intervals in the Y direction. Obviously, the specific configurations, such as the number and position of the inlet holes 70, are not limiting. Gas is supplied to the inlet holes for example, by a gas supply means, which is omitted in FIG. 2, via gas piping (not shown) connecting the gas supply means to the inlet holes 70. When the gas supply means is located outside the connection chamber 21, the gas piping is introduced from the gas supply means into the connection chamber 21 via a feedthrough provided in the connection chamber 21 so as not to destroy the pressure atmosphere (reduced-pressure atmosphere) in the connection chamber.

In the present embodiment, argon (Ar) gas 80 is introduced through the inlet holes 70. For example, the controller 12 controls the operation of the mechanism including the gas supply means described above, which is not shown in the figure, for introducing an argon gas 80. The argon gas 80 is a transparent gas that is transparent to the EUV light 6. In other words, the argon gas 80 does not obstruct the traveling of the EUV light 6 (e.g., occurrence of reflection or refraction of EUV light 6). Note that other types of transparent gases, such as helium (He) and hydrogen (H2), can also be introduced.

The pressure adjustment plate 71 is a member that increases the pressure of the internal space 9. The pressure adjustment plate 71 has a plate shape and has a circular opening 72 in the center. The pressure adjustment plate 71 fits over the entirety of the emission opening 63 of the enclosure section 60. In other words, the emission opening 63 is sealed by the pressure adjustment plate 71 except for the opening 72. In this way, the pressure adjustment plate 71 is disposed in the emission opening 63 such that the opening area of the emission opening 63 is reduced.

The shape of the opening 72 of the pressure adjustment plate 71 is set such that it does not block the traveling of the EUV light 6. In the present embodiment, as shown in FIG. 7, since the traveling area of the EUV light 6 is circular at the position of the pressure adjustment plate 71, the shape of the opening 72 is set to be circular having a slightly larger diameter than the traveling area of the EUV light. This prevents the traveling of the EUV light 6 from being blocked by the pressure adjustment plate 71.

Of the EUV light 6 traveling inside the light source apparatus 1, there may be some EUV light 6 that is finally utilized by the utilization equipment 42 and some EUV light 6 that is not utilized. In such a case, the pressure adjustment plate 71 is configured in a manner that it does not block the traveling of light needed to be finally utilized. In other words, a configuration in which the traveling of the needed light fails to be blocked is included in the configuration in which the traveling of the EUV light 6 in the present technology fails to be blocked.

The specific shape of the opening 72 of the pressure adjustment plate 71 is not limiting. It can adopt any shape, such as a rectangular shape, for example, that does not block the traveling of the EUV light 6. The pressure adjustment plate 71 corresponds to one embodiment of an emission-side member and a lid in accordance with the present technology. The pressure adjustment plate 71 also achieves a pressure-increasing mechanism in accordance with the present technology.

Each of the foils 61 has an opening 73. As shown in FIG. 6, the opening 73 has a rectangular shape and is provided at the center of the foil in the Z direction, and at the same position as the inlet holes 70 in the X direction. In other words, as shown in FIG. 8, the respective openings 73 form a buffer space 74 that has a rectangular parallelepiped shape and in which no foil 61 is present. Each of the inlet holes 70 is communicated with the buffer space 74.

Configuration with Two Pressure Adjustment Plates

Figure 9:
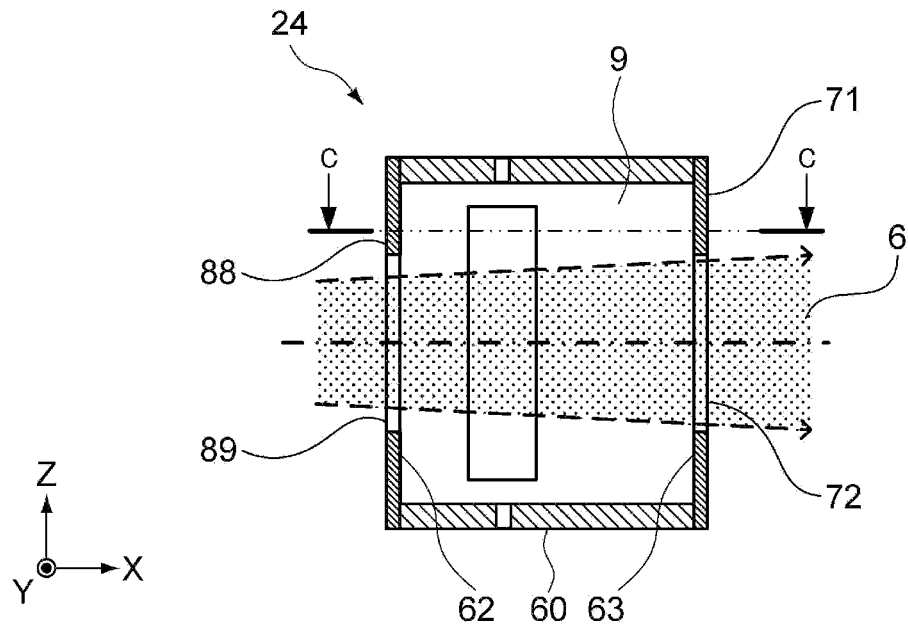
FIG. 9 is a schematic view illustrating a configuration example of a pressure adjustment plate.
Figure 10:
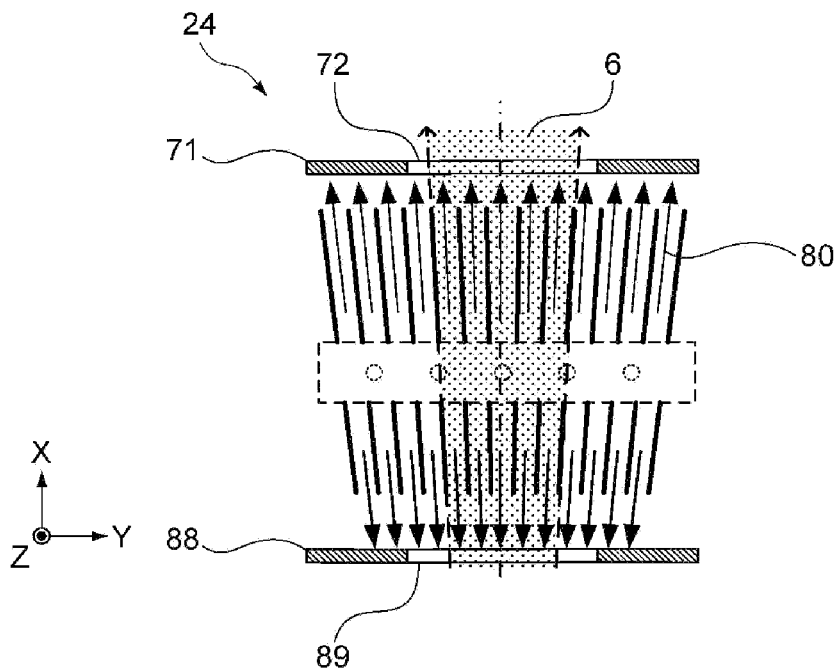
FIG. 10 is a schematic view illustrating a configuration example of a pressure adjustment plate.

FIGS. 9 and 10 are schematic views illustrating configuration examples of the pressure adjustment plates. FIG. is a cross-sectional view of the static foil trap 24 taken along line C-C of FIG. 9. Note that the enclosure section 60 is omitted to be illustrated in FIG. 10. As shown in FIGS. 9 and 10, the pressure adjustment plate may be provided at each of the incident opening 62 and the emission opening 63 of the enclosure section 60.

In the present example, the static foil trap 24 further includes a pressure adjustment plate 88. The pressure adjustment plate 88 has a plate shape as is similar to the pressure adjustment plate 71, and has a circular opening 89 in the center. The pressure adjustment plate 88 fits over the entirety of the incident opening 62 of the enclosure section 60. In other words, the incident opening 62 is sealed by the pressure adjustment plate 88 except for the opening 89. In this way, the pressure adjustment plate 88 is disposed in the incident opening 62 such that the opening area of the incident opening 62 is reduced.

The shape of the openings 89 of the pressure adjustment plate 88 is set in the same manner as the shape of the openings 72 of the pressure adjustment plate 71, so as not to block the traveling of the EUV light 6. In the present example, each of the openings 72 and 89 has the same circular shape; however, each of them may have a different shape. The pressure adjustment plate 88 corresponds to one embodiment of an incident-side member and a lid in accordance with the present technology. The pressure adjustment plate 71 and the pressure adjustment plate 88 achieve the pressure-increasing mechanism in accordance with the present technology.

Alternatively, a configuration in which the pressure adjustment plate 71 may not be provided at the emission opening 63, but the pressure adjustment plate 88 may be provided only at the incident opening 62.

The introduction of the argon gas 80 into the internal space 9 in the static foil trap 24 makes it possible to increase the probability of capturing the debris DB. Specifically, in the space where the argon gas 80 is present, the collision of the debris DB with the argon gas 80 reduces the traveling speed of the debris DB. In addition, the collision changes the traveling direction of the debris DB. The debris DB whose speed has been reduced and whose traveling direction has been changed is captured by the foils 61 and the enclosure section 60. In other words, more debris DB is captured compared to the case where no transparent gas is introduced into the internal space 9 in the static foil trap 24.

Figure 11:
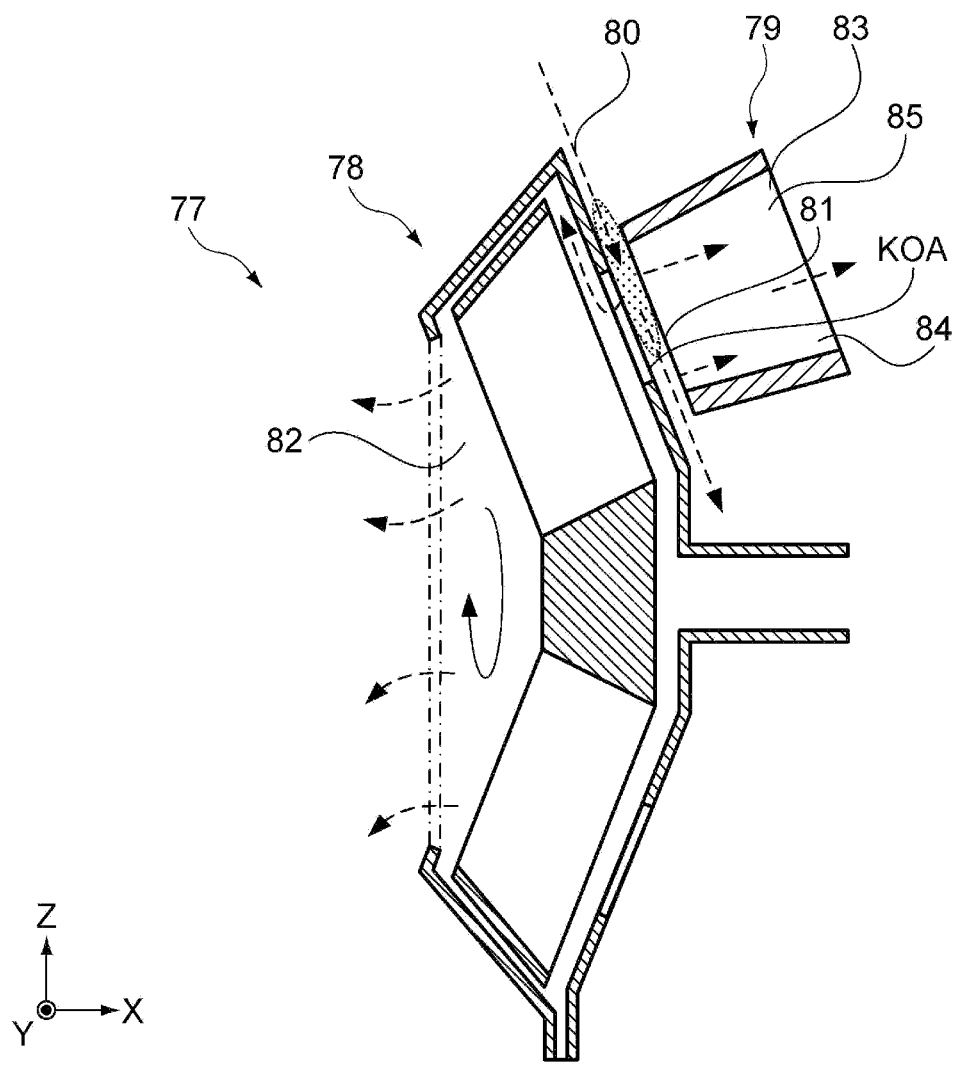
FIG. 11 is a schematic view illustrating a flow of argon gas in a debris mitigation device of a comparative example.

In addition, the inlet hole 70 is configured in the present embodiment for introducing the argon gas 80. This makes it possible to increase the pressure of the argon gas 80 in the internal space 9. FIG. 11 is a schematic view illustrating a flow of the argon gas 80 in a debris mitigation device 77 as a comparative example.

In the debris mitigation device 77 of the comparative example, the argon gas 80 is introduced from the upper side of a gap between a rotary foil trap 78 and a static foil trap 79. FIG. 11 schematically illustrates a direction in which the introduced argon gas 80 diffuses with a dashed arrow.

The argon gas 80 is introduced by a gas nozzle, for example, which is not shown in the figure. The argon gas 80 that has been introduced from the upper side of the gap diffuses toward the lower side inside the gap. As it diffuses, the pressure of the argon gas 80 decreases in the lower part of the gap. Hence, the upper part of the gap is an area where the pressure of the argon gas 80 is relatively high. FIG. 11 illustrates an area where the pressure of the argon gas 80 is relatively high in a polka-dot pattern.

The gap is communicated with an internal space 83 of the static foil trap 79. Hence, the argon gas 80 enters the internal space 83 through an incident opening 81 of the static foil trap 79 and diffuses in the internal space 83. However, the argon gas 80 present in the upper part of the gap has a higher pressure and thus tends to flow into the upper part of the internal space 83. In contrast, the argon gas 80 present in the lower part of the gap has a lower pressure and thus is less likely to flow into the lower part of the internal space 83. Hence, the pressure of argon gas 80 is relatively higher in the upper part of the internal space 83 than in the lower part thereof.

As described above, a pressure difference of the argon gas 80 also occurs in the internal space 83. In other words, the pressure distribution of the argon gas 80 in the area where the EUV light 6 travels becomes non-uniform, causing a spatial distribution (non-uniformity) for the ability of capturing the debris DB in the static foil trap 79.

Meanwhile, the gap is communicated with the internal space 82 of the rotary foil trap 78. Hence, the argon gas 80 enters the internal space 82 through the opening KOA of the rotary foil trap 78 and diffuses in the internal space 82.

In the static foil trap 79, the internal space 83 is separated by respective foils 84. Hence, the argon gas 80 is more likely to flow into the rotary foil trap 78 and is less likely to flow into the static foil trap 79. In other words, the static foil trap 79 fails to obtain a sufficient pressure of the argon gas 80, thereby preventing the improvement of capturing the debris DB.

In the debris mitigation device 3 of the present embodiment, the argon gas 80 is introduced directly into the internal space 9 of the static foil trap 24 through the inlet hole 70. This prevents the pressure distribution of the argon gas 80 in the internal space 9 from becoming non-uniform. This also makes it possible to maintain a high pressure of the argon gas 80 in the internal space 9. In other words, this enables the static foil trap 24 to improve the probability of capturing the debris DB.

Disposing the pressure adjustment plate 71 makes it possible to increase the pressure of the argon gas 80 in the internal space 9. In the static foil trap 79 of the comparative example, the argon gas 80 flowing into the internal space 83 diffuses to the right side in the internal space 83 and flows out from the emission opening 85. In contrast, in the static foil trap 24 of the present embodiment, part of the emission opening 63 is sealed by the pressure adjustment plate 71, thereby suppressing the outflow of the argon gas 80. Hence, the pressure of argon gas 80 in the internal space 9 increases.

Figure 12:
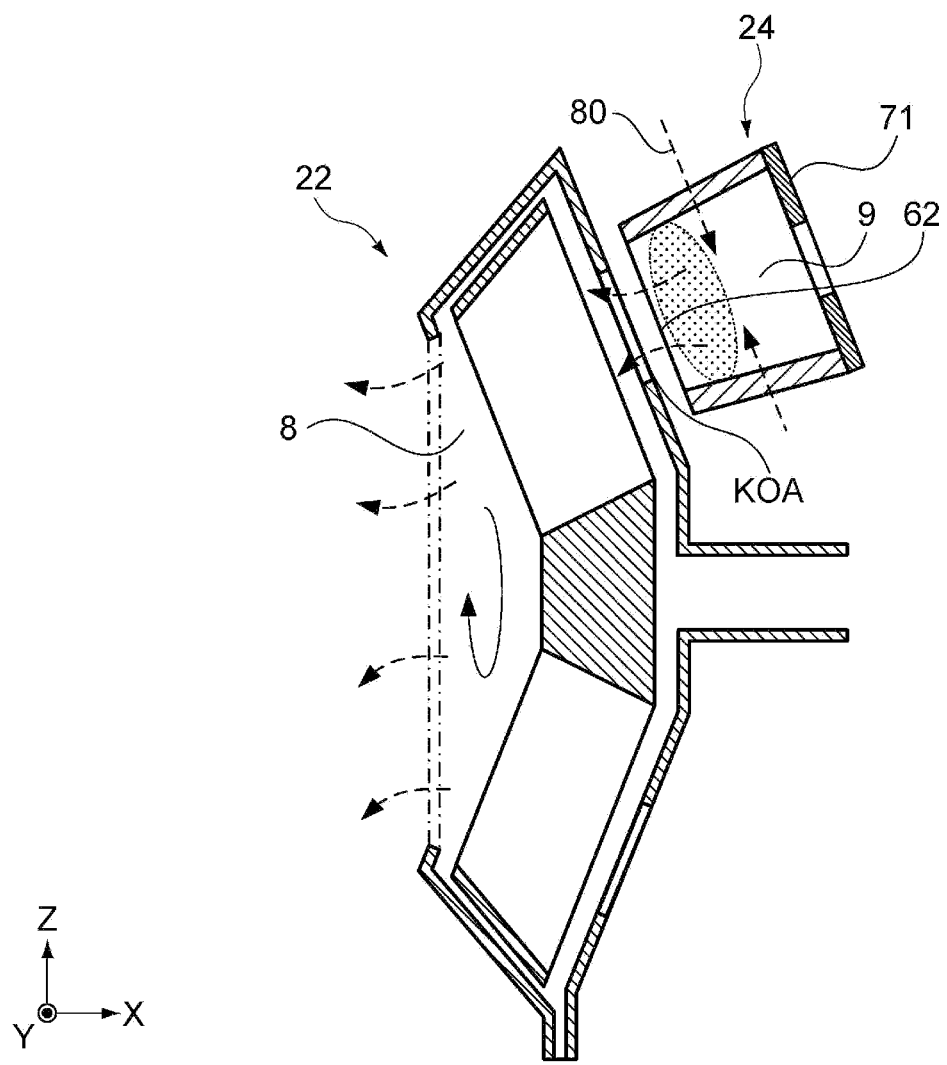
FIG. 12 is a schematic view illustrating a flow of argon gas in a debris mitigation device of a comparative example.

Furthermore, the pressure of the argon gas 80 in the rotary foil trap 22 can be increased by disposing the pressure adjustment plate 71. FIG. 12 is a schematic view illustrating the flow of the argon gas 80 in the debris mitigation device 3 of the present technology.

The pressure adjustment plate 71 is not disposed at the incident opening 62 of the static foil trap 24, but the pressure adjustment plate 71 is disposed only at the emission opening 63. Hence, the argon gas 80 introduced through the inlet holes 70 tends to flow toward the incident opening 62. This allows the vicinity of the incident opening 62 in the internal space 9 to be an area where the pressure of the argon gas 80 is relatively high. FIG. 12 illustrates the area where the pressure of the argon gas 80 is relatively high in a polka-dot pattern.

Hence, this may cause a situation in which the argon gas 80 flowing out of the incident opening 62 at a relatively high pressure enters the internal space 8 through the opening KOA of the rotary foil trap 22, and so on. As a result, the argon gas 80 is also introduced into the rotary foil trap 22, further improving the performance of capturing the debris DB.

In the case in which the two pressure adjustment plates 71 and 88 are provided, the argon gas 80 is less likely to flow out of the incident opening 62, and the pressure of argon gas 80 in the internal space 9 is further increased. This can further increase the probability of capturing the debris DB.

In the debris mitigation device 3 of the present embodiment, the buffer space 74 is configured in the internal space 9 of the static foil trap 24. The argon gas 80 introduced through the inlet holes 70 first diffuses in the buffer space 74. Then, it flows into a gap between each of the foils 61 on the left side and right side of the buffer space 74 (up-down direction, X-direction in FIG. 8). Then, the argon gas 80 diffuses toward the X direction in the gap between the foils 61. FIG. 8 schematically illustrates the direction of the argon gas 80 diffusing in the gap between the foils 61 with arrows.

The argon gas 80 temporarily stays in the buffer space 74 and flows into the gap between each of the foils 61 after the pressure becomes uniform. Hence, there is little difference in the pressure of the argon gas 80 in each gap. The configuration of the buffer space 74 thus makes the pressure of the argon gas 80 in the internal space 9 uniform, further improving the probability of capturing the debris DB.

In the present embodiment, debris is captured by both the rotary foil trap 22 and the static foil trap 24. This improves the probability of capturing the debris DB because it can handle both low-speed debris DB and high-speed debris compared to cases where only one of the rotary foil trap 22 or the static foil trap 24 is disposed.

In addition, in the present embodiment, the heat shield plate 23 is disposed between the plasma P and the rotary foil trap 22. Setting the shape of the opening KA of the heat shield plate 23 appropriately enables the shape of the EUV light 6 emitted from the light source apparatus 1 to be changed as desired. This can also reduce the amount of debris DB that travels to the rotary foil trap 22. Furthermore, this can prevent the overheating of the rotary foil trap 22 or the like due to the heat of the plasma P.

As described above, in the debris mitigation device 3 according to the present embodiment, the plurality of foils 61 is arranged in the internal space 9 of the enclosure section 60. In addition, a transparent gas flows into the internal space 9. Furthermore, the pressure adjustment plate 71 is disposed to increase the pressure of the internal space 9. This makes it possible to increase the probability of capturing the debris DB.

The EUV light source apparatus emits extreme ultraviolet light (EUV light) with a wavelength of approximately 13.5 nm. Such EUV light is used for lithography in manufacturing semiconductor devices, for example. Alternatively, mask blank inspection and pattern inspection are performed using EUV light as inspection light. EUV light source apparatuses are sometimes used as mask inspection systems, and the use of EUV light makes it possible to support 5 nm to 7 nm processes.

However, EUV light source apparatuses emit debris along with EUV light. Upon reaching the utilization equipment, debris may damage or contaminate the reflective film of optical elements in the utilization equipment, degrading the performance of the utilization equipment. Hence, a debris mitigation device is incorporated into the EUV light source apparatus to capture the debris in order to prevent debris from entering the utilization equipment. In such debris mitigation device, there is a need for a technology to improve the performance of capturing debris.

In the debris mitigation device 3 of the present technology, disposing the pressure adjustment plate 71 increases the pressure of the argon gas 80 in the internal space 9. This enables the debris mitigation device 3 to achieve high capturing performance.

Second Embodiment

Figure 13:
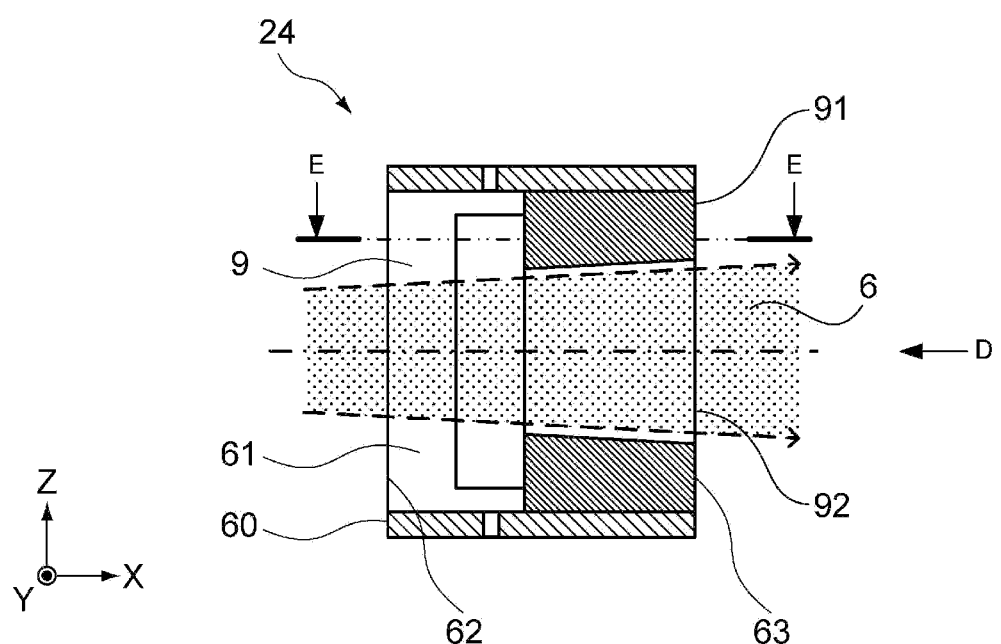
FIG. 13 is a schematic view illustrating a configuration example of a cavity restriction member.
Figure 14:
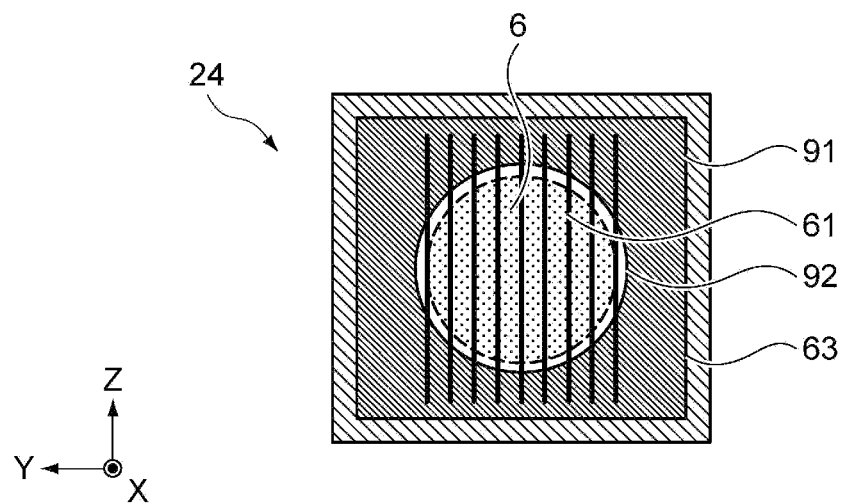
FIG. 14 is a schematic view illustrating a configuration example of a cavity restriction member.
Figure 15:
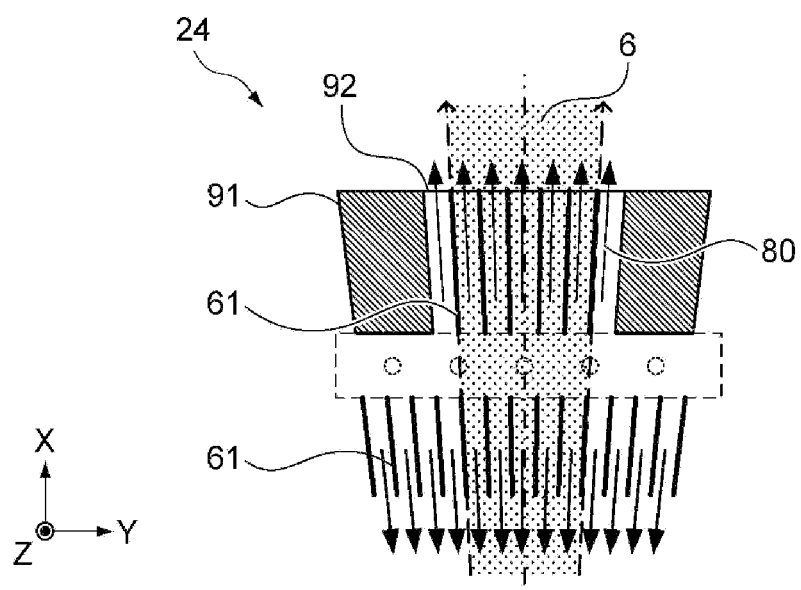
FIG. 15 is a schematic view illustrating a configuration example of a cavity restriction member.

Referring to FIGS. 13 through 15, the light source apparatus 1 of the second embodiment according to the present technology will be described. In the following description, the description will be omitted or simplified for the parts similar to the configuration and action of the light source apparatus 1 described in the above embodiment.

Cavity Restriction Member

FIGS. 13 through 15 are schematic views illustrating configuration examples of a cavity restriction member. FIG. 14 illustrates the static foil trap 24 viewed from the direction of arrow D in FIG. 13. FIG. 15 illustrates a cross-sectional view of the static foil trap 24 taken along E-E line in FIG. 13. The enclosure section 60 is not shown in FIG. 15. As shown in FIGS. 13 through 15, a cavity restriction member may be provided at the emission opening 63 of the enclosure section 60.

In the present example, the static foil trap 24 includes a cavity restriction member 91. The cavity restriction member 91 has a block shape. Specifically, the cavity restriction member 91 generally has a rectangular parallelepiped shape. The cavity restriction member 91 has an opening 92. The opening 92 is configured to be communicated with two opposing faces of the cavity restriction member 91. The shape of the opening 92, as is similar to the shape of the opening 72 of the pressure adjustment plate 71, is set so as not to block the traveling of the EUV light 6.

The cavity restriction member 91 is disposed at the emission opening 63 of the enclosure section 60. Specifically, the cavity restriction member 91 is embedded in the internal space 9 of the enclosure section 60 such that the opening 92 faces the emission opening 63. In other words, the cavity restriction member 91 is disposed to fill the internal space 9. The specific shape of the cavity restriction member 91 is not limiting; however, it may be any block-like shape. For example, the shape of the cavity restriction member 91 is set appropriately to conform to the shape of the enclosure section 60 in a manner that the cavity restriction member 91 can be embedded without gaps in the enclosure section 60. The specific thickness, etc. of the cavity restriction member 91 is not limiting.

The cavity restriction member 91 has grooves, into which the foils 61 are fitted. FIG. 14 is a schematic view illustrating a state in which the foils 61 are fitted into the grooves. In the area where the cavity restriction member 91 is present in the internal space 9, the foils 61 are fixed to the cavity restriction member 91 in this manner. In the area where the cavity restriction member 91 is absent, the foils 61 are fixed to the enclosure section 60.

Disposing the cavity restriction member 91 reduces the volume of the internal space 9. This makes the argon gas 80 less likely to flow out of the emission opening 63. This enables the pressure of the argon gas 80 in the static foil trap 24 to be maintained even higher.

The cavity restriction member 91 can be regarded as a shape such that the length of the opening 72 of the pressure adjustment plate 71 is increased in the direction in which the gas flows. Hence, the conductance of the cavity restriction member 91 is smaller than the conductance of the opening 72 of the pressure adjustment plate 71 in which the emission opening 63 is disposed. Therefore, it is possible to increase the pressure of the argon gas 80 in the internal space 9 by disposing the cavity restriction member 91 as described above, rather than disposing the pressure adjustment plate 71 at the emission opening 63.

The following combination may be employed as the arrangement configuration of the pressure adjustment plate 71 and the cavity restriction member 91.

(1) No arrangement at the incident opening 62, the pressure adjustment plate 71 at the emission opening 63
(2) No arrangement at incident opening 62, the cavity restriction member 91 at the emission opening 63
(3) The pressure adjustment plate 88 at the incident opening 62, no arrangement at the emission opening 63
(4) The pressure adjustment plate 88 at the incident opening 62, the pressure adjustment plate 71 at the emission opening 63
(5) The pressure adjustment plate 88 at the incident opening 62, the cavity restriction plate member 91 at the emission opening 63
(6) The cavity restriction member 91 at the incident opening 62, no arrangement at the emission opening 63
(7) The cavity restriction member 91 at the incident opening 62, the pressure adjustment plate 71 at the emission opening 63
(8) The cavity restriction member 91 at the incident opening 62, the cavity restriction member 91 at the emission opening The cavity restriction member 91 corresponds to one embodiment of an incident-side member, an emission-side member, and a block member in accordance with the present technology. The cavity restriction member 91 achieves the pressure-increasing mechanism in accordance with the present technology.

Other Embodiments

Figure 16:
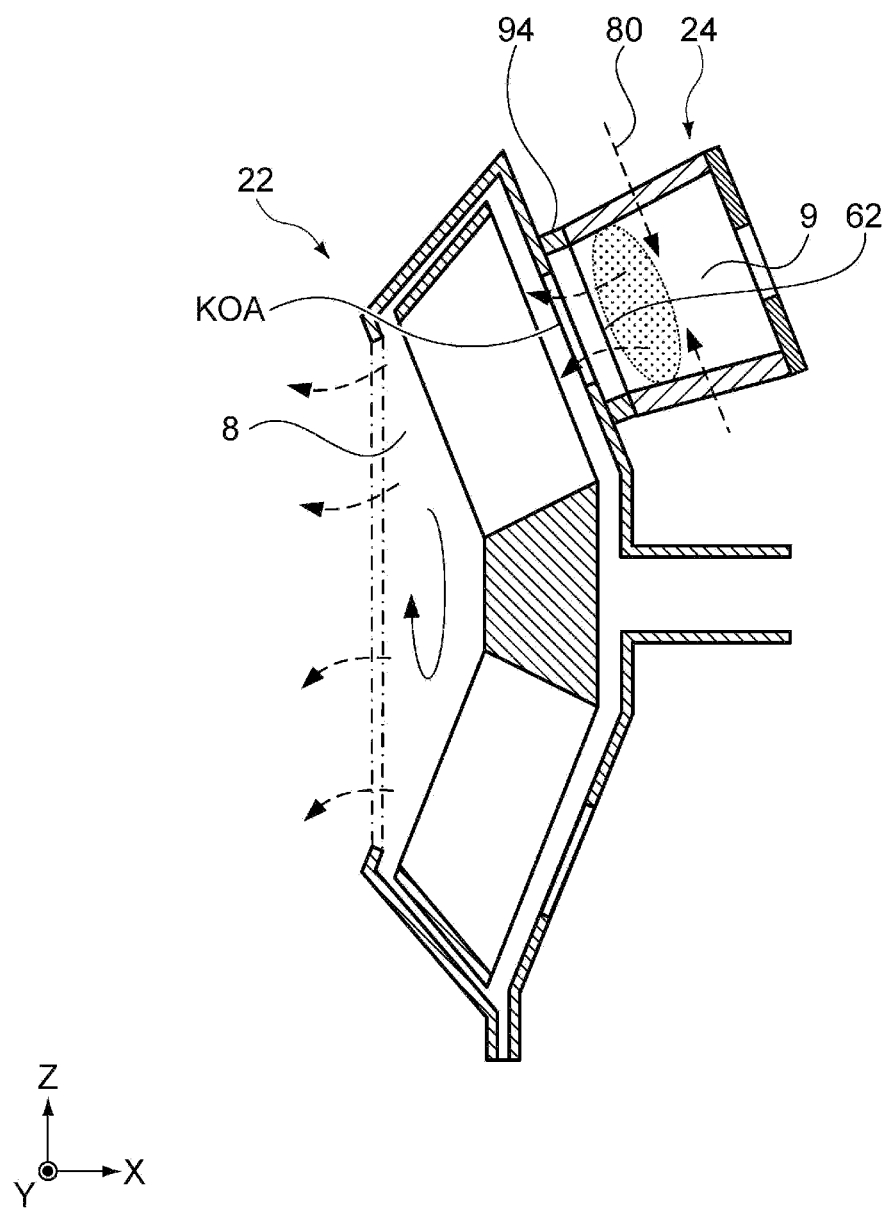
FIG. 16 is a schematic view illustrating a configuration example of a space connection member.

The present technology is not limited to the embodiments described above and can be employed in various other embodiments.
Space Connection Member FIG. 16 is a schematic view illustrating a configuration example of a space connection member. As shown in FIG. 16, a space connection member may be provided such that the rotary foil trap 22 is connected with the static foil trap 24.

In the present example, the debris mitigation device 3 includes a space connection member 94. The space connection member 94 has, for example, a ring shape. The diameter of the ring opening of the space connection member 94 is configured to be the same size as the diameter of the incident opening 62 of the static foil trap 24.

The space connection member 94 is disposed such that the gap between the rotary foil trap 22 and the static foil trap 24 is sealed by the ring portion of the space connection member 94. In other words, the space connection member 94 connects the opening KOA of the rotary foil trap 22 with the incident opening 62 of the static foil trap 24.

Figure 17:
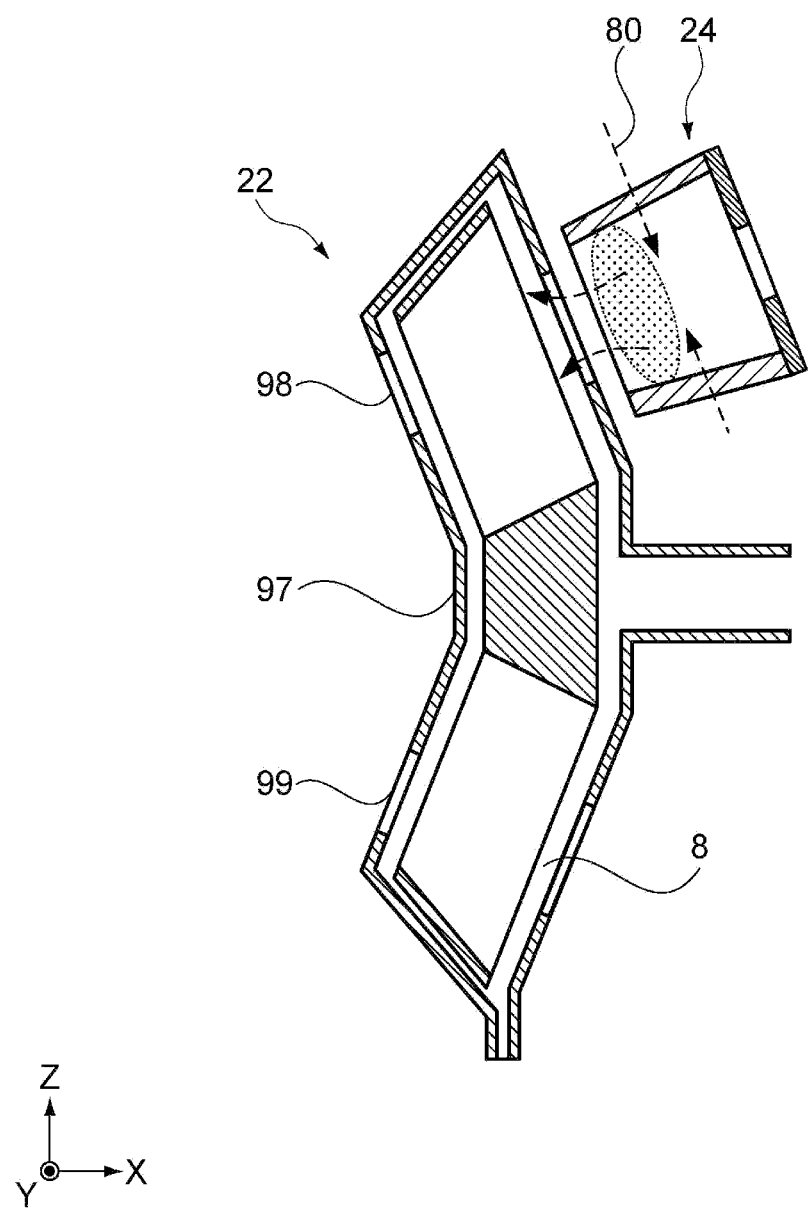
FIG. 17 is a schematic view illustrating a configuration example of a forward obstruction section.

This configuration enables all of the argon gas 80 flowing out of the incident opening 62 of the static foil trap 24 to flow into the rotary foil trap 22 without leaking to the upper side or the lower side of the gap. In other words, this configuration is capable of further increasing the pressure of the argon gas 80 in the internal space 8 of the rotary foil trap 22. The space connection member 94 corresponds to one embodiment of a connection member in accordance with the present technology.
Forward Obstruction Section FIG. 17 is a schematic view illustrating a configuration example of a forward obstruction section. As shown in FIG. 17, a forward obstruction section may be provided in the rotary foil trap 22.

In the present example, the rotary foil trap 22 further includes a forward obstruction section 97. The forward obstruction section 97 is configured to seal the opening KI on the left side of the cover member 25. In other words, the forward obstruction section 97 can be regarded as a part of the cover member 25. The forward obstruction section 97 has a plate shape that is circular when viewed from the left side and protrudes to the right side as moving toward the center of the circular shape.

The forward obstruction section 97 has openings 98 and 99. The opening 98 has a circular shape and is located in the center of the forward obstruction section 97 in the Y direction, and in the positive side in the Z direction. The opening 99 has a circular shape and is located in the center portion of the forward obstruction section 97 in the Y direction, and in the negative side in the Z direction. The specific shape and position of the openings 98 and 99 are not limiting.

This configuration seals most of the opening KI of the cover member 25, thereby suppressing the argon gas 80 flowing out of the static foil trap 24 into the rotary foil trap 22 from flowing out of the opening KI. In other words, this configuration makes it possible to maintain a high pressure of the argon gas 80 in the rotary foil trap 22.

The forward obstruction section 97 is disposed at the opening KI in a manner that the opening area of the opening KI is small. Hence, the forward obstruction section 97 can be regarded as the pressure adjustment plate 71 disposed in the rotary foil trap 22. Similarly, the right-side face of the cover member 25 can be regarded as the pressure adjustment plate 71. Alternatively, the cavity restriction member 91 may be disposed in the opening KI or the right-side face of the cover member 25.

Figure 18:
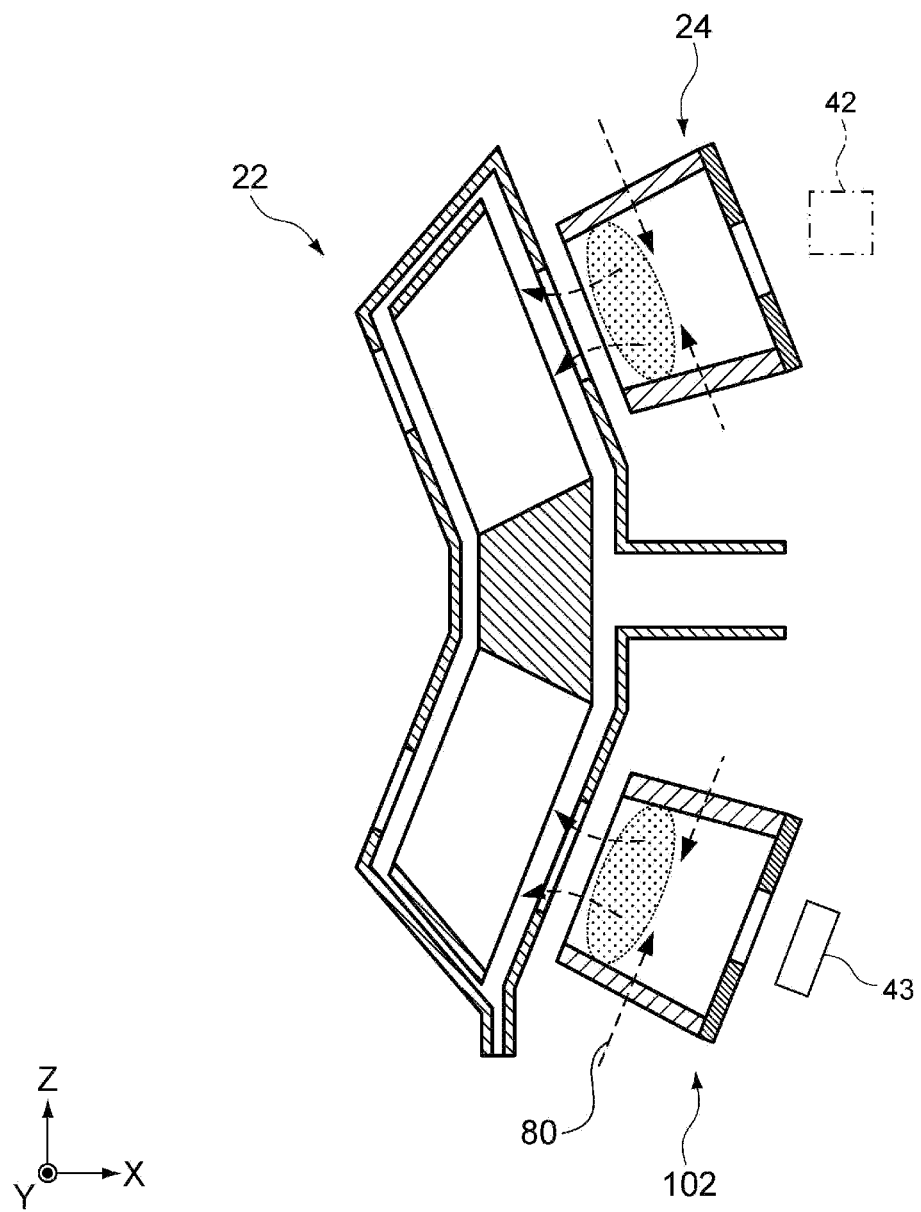
FIG. 18 is a schematic view illustrating a configuration example in which a static foil trap is disposed between a rotary foil trap and a monitoring device.

The forward obstruction section 97 corresponds to one embodiment of an incident-side member and a lid in accordance with the present technology. The forward obstruction section 97 achieves the pressure-increasing mechanism in accordance with the present technology.
Additional Static Foil Trap FIG. 18 is a schematic view illustrating a configuration example in which a static foil trap 102 is disposed between the rotary foil trap 22 and the monitoring device 43. As shown in FIG. 18, the static foil trap 102 may be additionally disposed between the rotary foil trap 22 and the monitoring device 43.

In the present example, debris mitigation device 3 includes the static foil traps 24 and 102. The static foil trap 24 is disposed between the rotary foil trap 22 and the utilization equipment 42, similar to the static foil trap 24 shown in FIG. 1, etc. The static foil trap 102 is disposed between the rotary foil trap 22 and the monitoring device 43. In other words, the static foil traps 24 and 102 can be regarded to be located between the plasma P and the utilization equipment 42, and between the plasma P and the monitoring device 43, respectively.

This configuration allows the debris DB to be trapped by the static foil trap 102, suppressing the traveling of the debris DB toward the monitoring device 43. In other words, this configuration prevents the monitoring device 43 from being damaged by the impact of the debris DB. In addition, this configuration allows the argon gas 80 that has been introduced into the static foil trap 102 to flow into the rotary foil trap 22, thereby capable of further increasing the pressure of the argon gas 80 in the rotary foil trap 22.

Magnetic Field Applying Means

Figure 19:
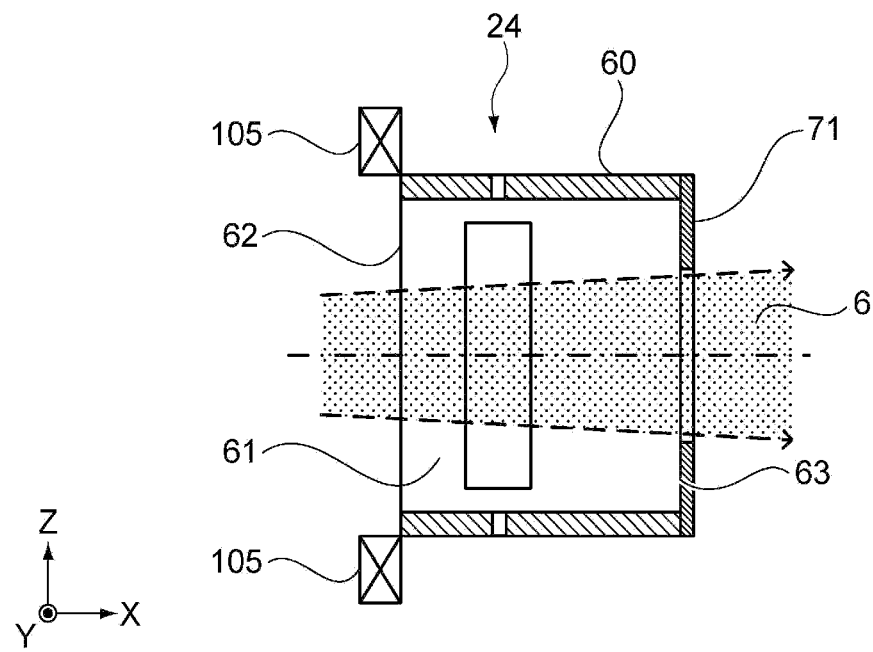
FIG. 19 is a schematic view illustrating a configuration example of a magnetic field applying means.
Figure 20:
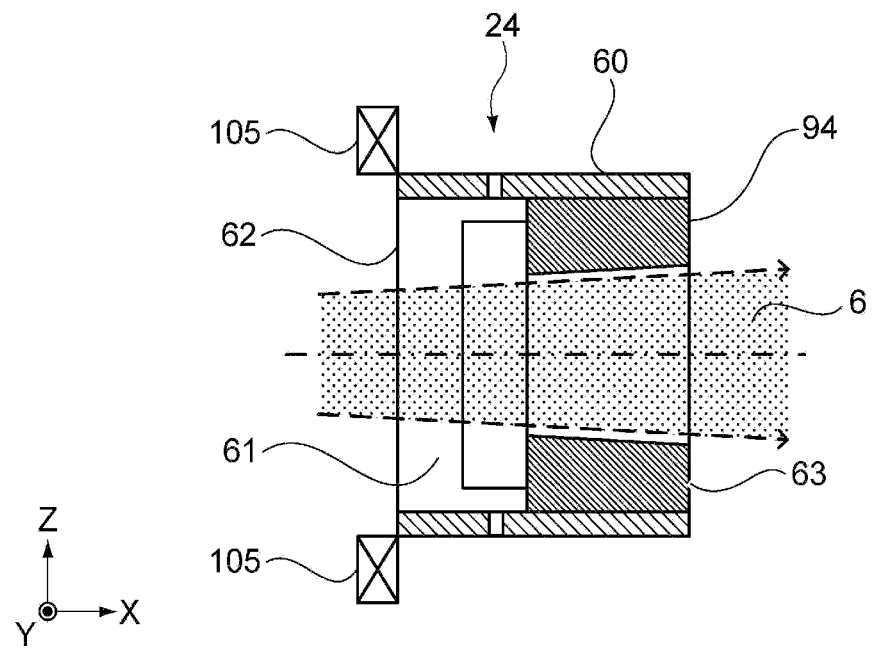
FIG. 20 is a schematic view illustrating a configuration example of a magnetic field applying means.
Figure 21:
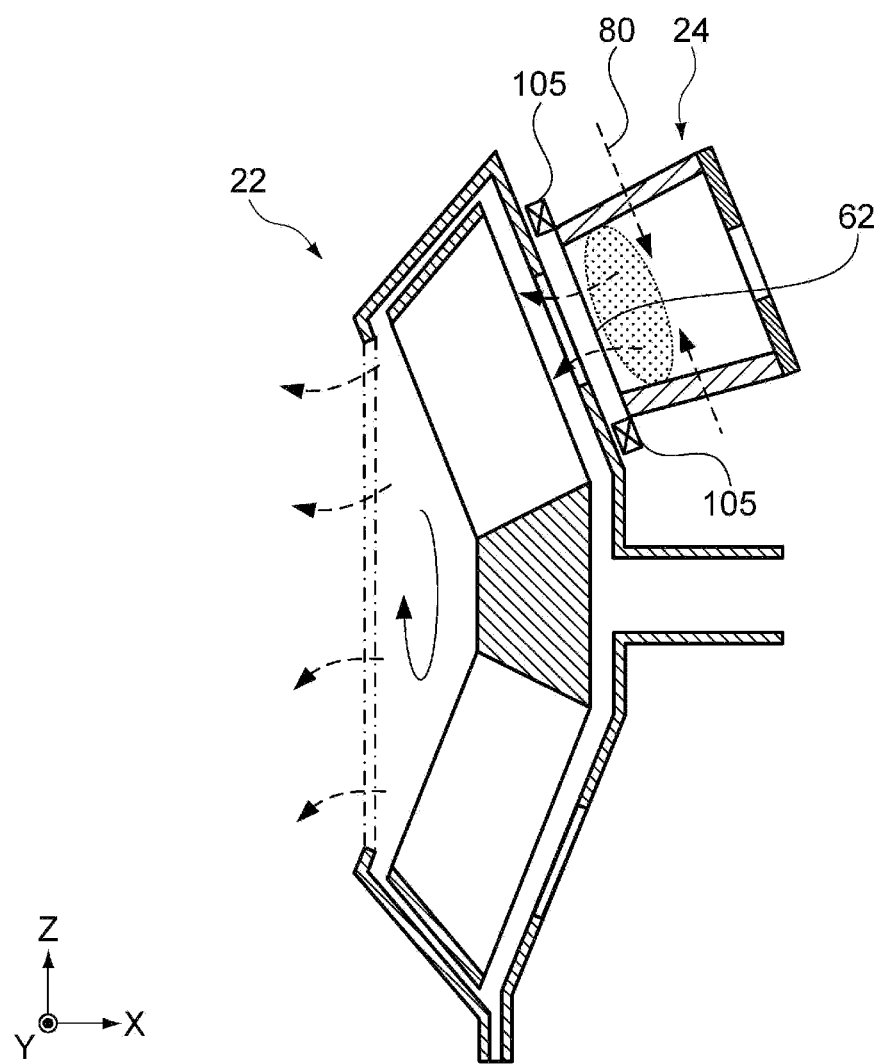
FIG. 21 is a schematic view illustrating a configuration example of a magnetic field applying means.

FIGS. 19 through 21 are schematic views illustrating configuration examples of a magnetic field applying means. FIG. 19 illustrates a view in which the static foil trap 24 with the pressure adjustment plate 71 disposed at the emission opening 63 is provided with a magnetic field applying means 105. FIG. 20 illustrates a view in which the static foil trap 24 with the cavity restriction member 91 disposed at the emission opening 63 is provided with the magnetic field applying means 105. As shown in FIGS. 19 to 21, the static foil trap 24 may be provided with a magnetic field applying means that applies a magnetic field.

In the present example, the static foil trap 24 includes the magnetic field applying means 105. The magnetic field applying means 105 is a means for applying a magnetic field to the surrounding space. For example, a permanent magnet is used as the magnetic field applying means 105. The magnetic field applying means 105 is located in the upper part and lower part of the incident opening 62 of the enclosure section 60.

The magnetic field applying means 105 generates a magnetic field that causes, of the particles contained in the argon gas 80, charged particles that are excited by the EUV light 6 to move in a direction away from the plurality of foils 61. In other words, the charged particles travel in various directions between each of the 61 foils; however, the magnetic field changes the traveling direction of the charged particles in a leftward direction, for example. In this case, the charged particles pass through the incident opening 62 and move outside the static foil trap 24. In other words, they move away from foil 61.

Alternatively, a magnetic field may be applied to allow the traveling direction of the charged particles to change in a rightward direction and cause the charged particles to move out of the static foil trap 24 through the emission opening 63. The direction and strength of the magnetic field can be adjusted by appropriately setting the types (permanent magnet, electromagnet, etc.), positions, or numbers of the magnetic field applying means 105, for example.

During the operation of the light source apparatus 1, the inventors observed that part of the foils 61 in the static foil trap 24 was especially damaged. This damage may be caused by the collision of the debris DB (e.g., ions, electrons, etc. of the plasma raw material SA moving at high speed), which are high-energy particles, against the foils 61. However, most of such high-energy debris DB traveling at high speed are considered to become neutral particles by colliding with the relatively high-pressure argon gas 80 before colliding with the foil 61, thus the energy of such debris DBs is considered to decrease. Hence, the main cause of damage to the foils 61 is not necessarily the collision of the debris DB with the foils 61.

Here, investigating the locations of damage to the foils 61 confirmed that damage to the foils 61 was particularly noticeable in areas where the pressure (density) of the argon gas 80 is relatively high and near areas where the EUV light 6 passes through. From this trend, damage to the foils 61 is presumably caused by the process such that the irradiation of the EUV light 6 excites at least part of the argon gas 80 to become charged particles with relatively high energy, and these charged particles of argon are in contact with the foils 61 to damage the foils 61.

In the present example, the magnetic field applying means 105 is provided in a manner that a magnetic field is imparted to an area in the vicinity of the incident opening 62, which is an area where the pressure (density) of the argon gas 80 is relatively high. This reduces the frequency with which charged particles collide with the foil 61, suppressing damage to the foils 61.

An electric field applying means may be provided to generate an electric field that causes the charged particles to move in a direction away from the plurality of foils 61. Providing the electric field applying means is similarly capable of suppressing damage to the foils 61. The magnetic field applying means 105 and the electric field applying means correspond to one embodiment of an electromagnetic field generator of the present technology.

Location of Buffer Space

Figure 22:
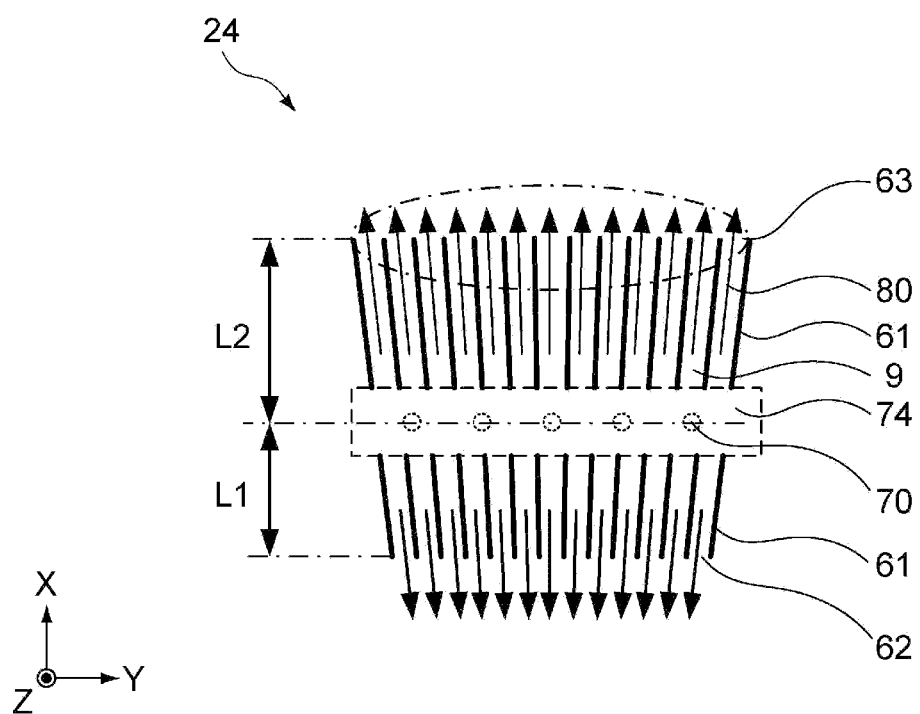
FIG. 22 is a schematic view illustrating a configuration example of a buffer space.

FIG. 22 is a schematic view illustrating a configuration example of the buffer space 74. In FIG. 22, the enclosure section 60 is omitted. The buffer space 74 may be located at any position.

In the present example, the buffer space 74 is configured such that the center of the buffer space 74 in the left-right direction (up-down direction in FIG. 22) is located at a distance L1 from the left end (lower end in FIG. 22) of the foils 61 and a distance L2 from the right end (upper end in FIG. 22) thereof. Here, L1 has a smaller value than L2. In other words, the buffer space 74 is configured on the left side (lower side in FIG. 22) with respect to the center of the internal space 9.

The foils 61 are arranged radially so as to extend in the ray direction of the EUV light 6, and the interval between the foils 61 is narrower on the side of the incident opening 62 of the EUV light 6 and wider on the side of the emission opening 63. Hence, the argon gas 80 supplied from the inlet holes 70 into the spaces divided by the foils 61 is less likely to flow toward the incident opening 62 and more likely to flow toward the emission opening 63. Hence, the pressure in the space in the vicinity of the emission opening 63 tends to be higher than the pressure in the space in the vicinity of the incident opening 62. Then, the attenuation of the intensity of the EUV light 6 by the argon gas 80 becomes impossible to be ignored in some cases.

Here, setting the buffer space 74 closer to the incident opening 62 (i.e., setting L1<L2), enables the pressure of the argon gas 80 in the downstream (right side) space through which the EUV light 6 passes to be relatively low. In FIG. 22, the area of relatively low pressure is shown as a dashed oval. This configuration shortens the optical path length of the space where the pressure of the argon gas 80 is high, thereby suppressing the argon gas 80 from attenuating the intensity of the EUV light 6. Note that the location of the buffer space 74 is not limited to the present example; however, the buffer space 74 may be configured at any location.

Configuration of Debris Mitigation Device

A configuration in which only the static foil trap 24 is disposed without rotary foil trap 22 may be adopted as a configuration of the debris mitigation device 3. Of course, as shown in FIG. 1, a configuration in which both the rotary foil trap 22 and the static foil trap 24 are arranged may be adopted. Alternatively, a plurality of the rotary foil traps 22 and the static foil traps 24 may also be arranged.

The configurations of the light source apparatus, the light source section, the debris mitigation device, the rotary foil trap, the static foil trap, or the like described with reference to the respective drawings are merely one embodiment, and can be modified to the extent not to depart from the purpose of the present technology. In other words, other configurations may be adopted to implement the present technology.

In the present disclosure, words such as "about", "nearly", and "approximately" are suitably used to readily understand the explanation. On the other hand, there is no clear difference between the cases in which the words "about", "nearly", and "approximately" are used and the cases in which they are not used. In other words, in the present disclosure, concepts that define shape, size, position relationship, and state, such as "center", "middle", "uniform", "equal", "same", "orthogonal", "parallel", "symmetrical", "extending", "axial direction", "cylindrical shape", "cylindrical hollow shape", "ring shape", "annular shape", "rectangular parallelepiped shape", "disc shape", "plate shape", "circular shape", "rectangular shape", "square shape", and "block shape" are concepts including "substantially center", "substantially middle", "substantially uniform", "substantially equal", "substantially same", "substantially orthogonal", "substantially parallel", "substantially symmetrical", "substantially extending", "substantially axial direction", "substantially cylindrical shape", "substantially cylindrical hollow shape", "substantially ring shape", and "substantially annular shape", "substantially rectangular parallelepiped shape", "substantially disc shape", "substantially plate shape", "substantially circular shape", "substantially rectangular shape", "substantially square shape", and "substantially block shape". The concepts also include concepts having states in a predetermined range (e.g., ±10% range) with respect to, for example, "exactly center", "exactly middle", "exactly uniform", "exactly equal", "exactly same", "exactly orthogonal", "exactly parallel", "exactly symmetrical", "exactly extending", "exactly axial direction", "exactly cylindrical shape", "exactly cylindrical hollow shape", "exactly ring shape", "exactly annular shape", "exactly rectangular parallelepiped shape", "exactly disc shape", "exactly plate shape", "exactly circular shape", "exactly rectangular shape", "exactly square shape", and "exactly block shape" and the like. Hence, even when the words such as "about", "nearly", and "approximately" are not added, the concepts may include those that are expressed by adding "about", "nearly", "approximately", and the like. Conversely, states expressed by adding "about", "nearly", "approximately", and the like do not necessarily exclude their exact states.

In the present disclosure, expressions using the term "than" such as "greater than A" and "less than A" are expressions that comprehensively include concepts that include the case that is equal to A and concepts that do not include the case that is equal to A. For example, "greater than A" is not limited to the case where it does not include "equal to A"; however, it also includes "equal to or greater than A". Also, "less than A" is not limited to "less than A"; it also includes "equal to or less than A". Upon the implementation of the present technology, specific settings and other settings are suitably adopted from the concepts that are included in "greater than A" and "less than A" to achieve the effects described above.

Among the characteristic portions according to the present technology described above, it is also possible to combine at least two of the characteristic portions. In other words, the various characteristic portions described in each embodiment may be optionally combined without being restricted to the embodiments. The various effects described above are merely examples and are not limiting; other effects may also be achieved.

What is claimed is:

1. A debris mitigation device that captures debris released from a light source, the debris mitigation device comprising a static foil trap including:
    an enclosure section including an incident opening through which light emitted from the light source enters, an emission opening through which the light that has entered through the incident opening is emitted, and an internal space in which the light travels;
    a plurality of foils being fixed in an area of the internal space in which the light travels;
    an inlet hole being configured to be communicated with the internal space in the enclosure section and allowing a transparent gas transparent to the light to flow into the internal space; and
    a pressure-increasing mechanism including at least one of an incident-side member disposed at the incident opening in a manner that an opening area of the incident opening is reduced without blocking a traveling of the light, and an emission-side member disposed at the emission opening in a manner that an opening area of the emission opening is reduced without blocking the traveling of the light; the pressure-increasing mechanism increasing a pressure of the internal space.

2. The debris mitigation device according to claim 1, wherein at least one of the incident-side member and the emission-side member is a lid that is formed with a plate shape and that has an opening through which the light passes.

3. The debris mitigation device according to claim 1, wherein at least one of the incident-side member and the emission-side member is a block member that is formed with a block shape, that has an opening through which the light passes, and that is disposed to fill the internal space.

4. The debris mitigation device according to claim 1, wherein the static foil trap includes an electromagnetic field generator that generates an electric field or a magnetic field that causes, of particles contained in the transparent gas, charged particles that are excited by the light to move in a direction away from the plurality of foils.

5. The debris mitigation device according to claim 1, wherein the internal space includes a buffer space in which the plurality of foils are absent, and the inlet hole is configured to be communicated with the buffer space.

6. The debris mitigation device according to claim 1, wherein the static foil trap is disposed between the light source and utilization equipment that utilizes the light emitted from the light source, and between the light source and a monitoring device that monitors a state of the light emitted from the light source.

7. The debris mitigation device according to claim 1, wherein the light source includes plasma.

8. The debris mitigation device according to claim 1, further comprising a rotary foil trap, the rotary foil trap including:
    a cover member including an incident opening through which the light emitted from the light source enters, an emission opening through which the light that has entered is emitted, and an internal space in which the light travels; and
    a plurality of rotation foils rotatably mounted in an area of the internal space in which light travels.

9. The debris mitigation device according to claim 8, wherein the rotary foil trap includes a pressure-increasing mechanism including at least one of an incident-side member disposed at the incident opening in a manner that an opening area of the incident opening is reduced without blocking a traveling of the light, and an emission-side member disposed at the emission opening in a manner that an opening area of the emission opening is reduced without blocking the traveling of the light, and the pressure-increasing mechanism increasing a pressure of the internal space.

10. The debris mitigation device according to claim 8, further comprising a connection member connecting the emission opening of the rotary foil trap to the incident opening of the static foil trap,
   wherein the static foil trap and the rotary foil trap are disposed such that the incident opening of the static foil trap and the emission opening of the rotary foil trap face each other.

11. The debris mitigation device according to claim 8, further comprising an aperture disposed between the light source and the rotary foil trap and has an opening through which part of the light emitted from the light source is extracted.

12. A light source apparatus comprising a debris mitigation device that captures debris released from plasma, the debris mitigation device including:
   a plasma generation chamber in which a raw material that is to emit light is made to be excited to generate the plasma;
   a light extraction section in which light that has been emitted from the plasma is extracted; and
   a static foil trap disposed between the plasma generation chamber and the light extraction section and,
   the static foil trap including:
      an enclosure section including an incident opening through which light emitted from the plasma enters, an emission opening through which the light that has entered through the incident opening is emitted, and an internal space in which the light travels;
      a plurality of foils being fixed in an area of the internal space in which the light travels;
      an inlet hole being configured to be communicated with the internal space in the enclosure section and allowing a transparent gas transparent to the light to flow into the internal space; and
      a pressure-increasing mechanism including at least one of an incident-side member disposed at the incident opening in a manner that an opening area of the incident opening is reduced without blocking a traveling of the light, and an emission-side member disposed at the emission opening in a manner that an opening area of the emission opening is reduced without blocking the traveling of the light; the pressure-increasing mechanism increasing a pressure of the internal space.

13. The light source apparatus according to claim 12, wherein the debris mitigation device includes a rotary foil trap, the rotary foil trap including:
   a cover member including an incident opening through which the light emitted from the light source enters, an emission opening through which the light that has entered is emitted, and an internal space in which the light travels; and
   a plurality of rotation foils rotatably mounted in an area of the internal space in which the light travels.

* * * * *